(12) United States Patent
Hirai et al.

(10) Patent No.: US 7,365,008 B2
(45) Date of Patent: Apr. 29, 2008

(54) PATTERN FORMING METHOD, DEVICE, METHOD OF MANUFACTURE THEREOF, ELECTRO-OPTICAL APPARATUS, AND ELECTRONIC APPARATUS

(75) Inventors: Toshimitsu Hirai, Chino (JP); Toshiaki Mikoshiba, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/508,885

(22) Filed: Aug. 24, 2006

(65) Prior Publication Data
US 2006/0286704 A1     Dec. 21, 2006

Related U.S. Application Data

(62) Division of application No. 10/849,001, filed on May 20, 2004, now Pat. No. 7,199,033.

(30) Foreign Application Priority Data

May 28, 2003 (JP) ............................. 2003-151284
Apr. 20, 2004 (JP) ............................. 2004-124211

(51) Int. Cl.
*H01L 21/44* (2006.01)
(52) U.S. Cl. ............................. 438/674; 257/E21.001
(58) Field of Classification Search .................... None
See application file for complete search history.

(56) References Cited
U.S. PATENT DOCUMENTS 6,179,400 B1   1/2001   Akahira et al.
6,524,876 B1   2/2003   Baek et al.
6,593,591 B2   7/2003   Yudasaka et al.
6,734,029 B2   5/2004   Furusawa
7,214,617 B2 * 5/2007   Hirai ........................ 438/676
2004/0201048 A1  10/2004  Seki et al.
2006/0035064 A1   2/2006  Hirai

FOREIGN PATENT DOCUMENTS

| JP | A-05-061069 | 3/1993 |
| JP | A-05-259300 | 10/1993 |
| JP | A-05-326728 | 12/1993 |
| JP | A-08-327816 | 12/1996 |
| JP | A-11-274671 | 10/1999 |
| JP | A-2000-216330 | 8/2000 |
| JP | A-2002-164635 | 6/2002 |
| JP | A-2002-261048 | 9/2002 |
| JP | A-2002-343953 | 11/2002 |
| JP | A-2003-317945 | 11/2003 |
| KR | A-2001-0009269 | 2/2001 |

* cited by examiner

*Primary Examiner*—Scott B. Geyer
(74) *Attorney, Agent, or Firm*—Oliff & Berridge, PLC

(57) ABSTRACT

A method of forming a predetermined pattern by disposing a functional liquid on a substrate, the method includes the steps of forming banks on the substrate, and disposing the functional liquid on a region divided by the banks, wherein a width of the region is partially formed so as to be large.

5 Claims, 18 Drawing Sheets

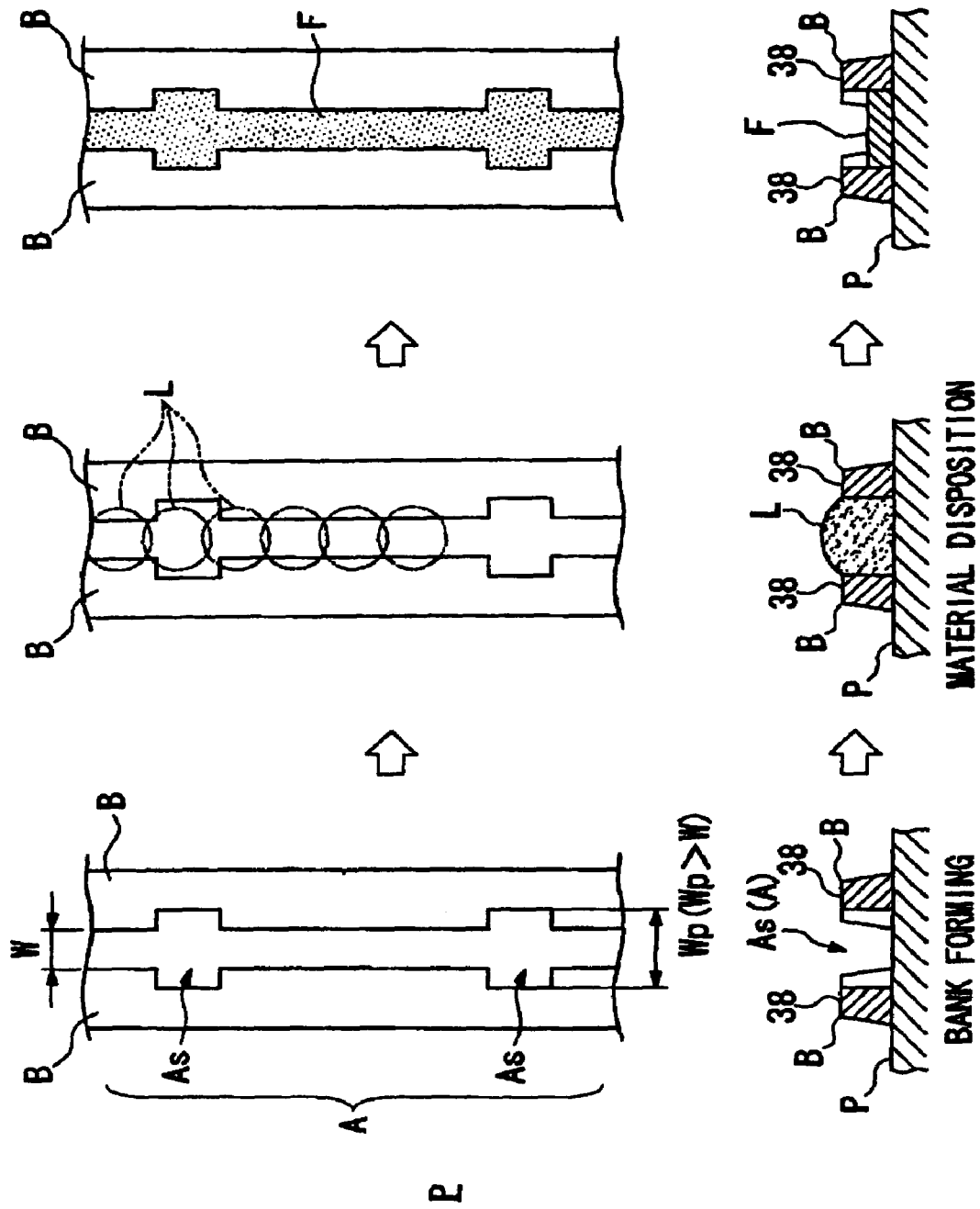

PATTERN FORMING METHOD, DEVICE, METHOD OF MANUFACTURE THEREOF, ELECTRO-OPTICAL APPARATUS, AND ELECTRONIC APPARATUS

This is a Divisional of application Ser. No. 10/849,001 filed May 20, 2004. This application claims the benefit of Japanese Patent Application No. 2003-151284, filed May 28, 2003 and Japanese Patent Application No. 2004-124211, filed Apr. 20, 2004. The entire disclosures of the prior applications are hereby incorporated by reference herein in their entirety.

BACKGROUND OF THE INVENTION

1. Field of the Invention

The present invention relates to a pattern forming method, a device, a method of manufacture thereof, an electro-optical apparatus, and electronic apparatus.

2. Description of Related Art

As a method of forming a wiring pattern used for electronic circuits, integrated circuits, or the like, for example, a photolithography method has been used. This photolithography method requires large scale equipment such as vacuum apparatus and complicated steps. Moreover, the efficiency of using material is only a few percent, and hence most of the material is wasted, resulting in high manufacturing cost.

With respect to this, as shown for example in Japanese Unexamined Patent Application, First Publication No. H11-274671, and Japanese Unexamined Patent Application, First Publication No. 2000-216330, a method has been proposed where a pattern is formed on a substrate using a droplet discharge method being a so called inkjet method, in which a liquid material is discharged from a droplet discharge head in the form of droplet. In this method, a liquid material for patterning (functional liquid) is directly disposed in a pattern on the substrate, and then converted into the pattern by heat treatment or laser radiation. According to this method, the merits are such that photolithography becomes unnecessary, the process can be greatly simplified, and the amount of raw material used is less.

Recently, densification of circuits for configuring devices has been advancing, and for example for the wiring there has been a demanded for this to be made finer with a thinner line. In the pattern forming method using the abovementioned droplet discharge method, since the discharged droplet spreads out on the substrate after landing, it has been difficult to stably form a fine pattern.

Particularly, in the case where the pattern becomes a conductive film, the liquid is trapped (bulged) due to the spread of the droplet, causing concern of defects such as disconnection or short-circuit.

Moreover, another technique has been proposed for forming wiring having a narrower width than the diameter of in flight functional liquid discharged by the droplet discharge method. In such a technique, in a state where the surface of banks sectioning the wiring forming region is made repellent, the functional liquid is discharged toward the wiring forming region, so that, even in the case where the functional liquid is partially discharged on the top surface of the banks, all of the functional liquid flows into the wiring forming region.

However, recently, it has been found that if the functional liquid partially contacts with the top surface of the bank, a fine residue remains on the top surface of the bank. For example, in the case where the functional liquid is conductive, the residue also becomes conductive. Therefore, if the residue remains as described above, there is concern that the characteristic of the wiring itself and the characteristic of a device using this wiring may be changed.

The present invention takes the above problems into consideration with the object of providing a pattern forming method, a device, a method of manufacture thereof, an electro-optical apparatus, and an electronic apparatus, in which a thin linear pattern can be accurately and stably formed.

SUMMARY OF THE INVENTION

The first aspect of the present invention is a method of forming a predetermined pattern by disposing a functional liquid on a substrate, the method having the steps of forming banks on the substrate, and disposing the functional liquid on a region divided by the banks, wherein a width of the region is partially formed so as to be large.

In this aspect, the functional liquid is disposed in a region sectioned by the banks and the functional liquid is dried so that a predetermined pattern is formed on the substrate. In this case, since the shape of the pattern is defined by the banks, then by appropriately forming the banks for example, by making the width between adjacent banks narrower, the pattern can be made finer with thinner lines.

Moreover, in this aspect, since the width of the region sectioned by the banks is partially formed so as to be large, part of the functional liquid escapes into this broad width section, thus preventing overflow of the functional liquid from the banks when disposing the functional liquid. Therefore, the pattern is formed accurately in a desired form.

Consequently, in the pattern forming method of the present invention, a thin linear pattern can be accurately and stably formed.

In the pattern forming method, a width of a part of the aforementioned region is preferably 110 to 500% of the width of other parts.

Since, in the region sectioned by the banks, the width of a portion is 110 to 500% of the width of other portion, the functional liquid is reliably kept from overflowing from the banks when disposing the functional liquid.

Moreover, in the pattern forming method, the region is formed so that it is greater in width partially at a portion crossing over another pattern.

According to this pattern forming method, the space on the substrate is effectively utilized.

Moreover, in the pattern forming method, the region is formed so that it is narrower in width partially at a portion crossing over another pattern.

According to this pattern forming method, the volume is not accumulated at the crossing section of the pattern, and the device characteristic can be improved.

Moreover, in the pattern forming method, the functional liquid is preferably disposed onto the aforementioned region using a droplet discharge method.

According to this pattern forming method, by using the droplet discharge method, the consumption of liquid material less is wasted less and the amount and position of the functional liquid disposed on the substrate can be easily controlled, compared to the other coating techniques such as a spin coating method.

The width between the adjacent banks may be made narrower than the diameter of the droplet. In this case, the functional liquid in droplet form flows into between the banks due to the capillary phenomenon. Therefore, a pattern having a smaller line width than the diameter of the droplet being discharged is formed.

Moreover, the functional liquid contains conductive particles so that a pattern having conductivity can be formed. Therefore, this pattern may be applied to various devices as wiring.

Next, the second aspect of the present invention is a method of forming a predetermined pattern by discharging and disposing a functional liquid on a substrate using a droplet discharge method, the method having the steps of forming banks on the substrate so that a broad width section having a larger width than a diameter of in flight functional liquid, and a narrow width section having a narrower width than the broad width section are disposed and connected and disposing the functional liquid into the broad width section and the narrow width section by discharging and disposing the functional liquid into the broad width section and then by flowing the functional liquid into the narrow width section.

According to the present embodiment, of the broad width section and the narrow width section sectioned by the banks, the functional liquid is discharged and disposed into the broad width section, and the functional liquid becomes wet to spread out so as to flow into the narrow width section. Accordingly, by discharging the functional liquid only to the broad width section, the functional liquid can be disposed into the broad width section and the narrow width section.

Moreover in this aspect, since the broad width section has a larger width than the diameter of in flight functional liquid, the functional liquid does not partially contact with the top surface of the bank. Therefore, it is possible to avoid the situation where a residue of functional liquid remains on the top surface of the bank.

Consequently, in the present embodiment, a pattern demonstrating the desired characteristics can be stably formed.

Moreover, in the pattern forming method, the functional liquid may be discharged and disposed in a crossing region of the broad width section and the narrow width section.

According to this forming method, since the functional liquid discharged and disposed on the crossing region can easily flow into the narrow width section when being wet to spread out, it becomes possible to dispose the functional liquid more smoothly into the narrow width section.

Moreover, in the pattern forming method, after discharging and disposing the functional liquid so as to enclose the crossing region of the broad width section and the narrow width section, the functional liquid may be discharged and disposed on the crossing region.

According to this pattern forming method, by means of the functional liquid previously discharged and disposed so as to enclose the crossing region, wetting and spreading of the functional liquid discharged and disposed on the crossing region is blocked, so that the flow quantity of the functional liquid toward the narrow width section can be increased. Accordingly, it becomes possible to arrange the functional liquid more smoothly into the narrow width section.

The third aspect of the present invention is a method of manufacturing a device having a substrate on which a pattern is formed, and the pattern is formed by the abovementioned pattern forming method.

According to this aspect, the pattern formed in a device can be stably made finer with thinner lines. Therefore, a highly accurate device can be stably manufactured.

Particularly in the case where the pattern constitutes part of a switching element such as a TFT (film transistor) provided on the substrate, a highly integrated switching element can be stably obtained.

The fourth aspect of the present invention is a device having a high accuracy by being manufactured using the abovementioned device manufacturing method.

The fifth aspect of the present invention is an electro-optical apparatus having the abovementioned device.

Examples of electro-optical apparatus include, for example, a liquid crystal display, an organic electroluminescence display device, a plasma display device, and the like.

Moreover, the sixth aspect of the present invention is an electronic apparatus having the abovementioned electro-optical apparatus.

According to these aspects of the invention, by having a highly accurate device, the quality and performance can be increased.

Moreover, the seventh aspect of the present invention is a method of manufacturing an active matrix substrate having a first step of forming a gate wiring on a substrate, a second step of forming a gate insulating film on the gate wiring, a third step of laminating a semiconductor layer via the gate insulating film, a fourth step of forming a source electrode and a drain electrode on the gate insulating layer, a fifth step of disposing an insulating material on the source electrode and the drain electrode, and a sixth step of forming a pixel electrode which is electrically connected to the drain electrode, wherein any one of the first step, the fourth step and the sixth step, uses the pattern forming method of the present invention.

According to these aspects, it becomes possible to accurately and stably form an active matrix substrate having a thin linear pattern.

BRIEF DESCRIPTION OF THE DRAWINGS

FIG. 1 is a schematic diagram showing a pattern forming method of the present invention.

DETAILED DESCRIPTION OF THE INVENTION

Figure 2A:
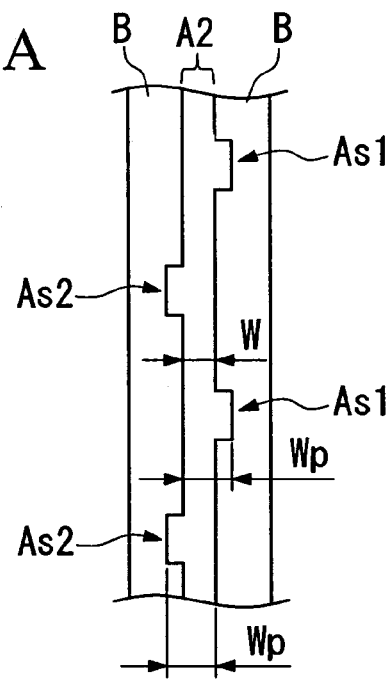
FIG. 2A and FIG. 2B show other examples of a linear region.

Hereunder is a description of the present invention, with reference to the drawings.

FIRST EMBODIMENT

FIG. 1 is a schematic diagram showing a pattern forming method of the present invention.

The pattern forming method of the present invention includes a bank forming step for forming banks B on a substrate P, and a material disposition step of disposing a functional liquid L in a linear region "A" sectioned by the banks B.

In the pattern forming method of the present invention, this functional liquid L is disposed in a linear region A sectioned by the banks B, and the functional liquid L is dried so that a linear pattern F is formed on the substrate P. In this case, since the shape of the pattern F is defined by the banks B, by appropriately forming the banks B, for example by making the width between the adjacent banks B narrower, the pattern F can be made finer with thinner lines. After forming the pattern F, the banks B may be removed from the substrate P, or may remain on the substrate P as is.

Moreover, in the pattern forming method of the present invention, when forming the banks B on the substrate P, the width of the linear region A sectioned by the banks B is broadened at one part. That is, in a predetermined position in relation to the axial direction of the linear region A, a singular or a plurality of portion(s) having broader width Wp compared to the width W of other region (Wp>W) (hereunder, called broad width section As as required) is (are) disposed.

Here, for a method of forming the banks B, any method such as a lithography method, a printing method or the like may be used. For example, if the lithography method is used, then by a predetermined method such as spin coating, spray coating, roll coating, dye coating, dip coating or the like, a layer composed of a forming material for the banks is formed on the substrate P. Then, patterning is performed thereon by etching or ashing, so that banks B having a predetermined pattern form can be obtained. The banks B may be formed on a body that is different from the substrate P, which is then disposed on the substrate P.

Examples of forming material for the banks B include polymeric materials such as acrylic resin, polyimide resin, olefin resin, melamine resin, and materials including inorganic substance such as silica.

In the pattern forming method of the present invention, since the width of the linear region A sectioned by the banks B is partially formed in a broad width (broad width section As), when disposing the functional liquid L, the functional liquid L partially escapes into this broad width section As, enabling prevention of overflow of the functional liquid L from the banks B.

Generally, when disposing a liquid in a linear region, due to the function of the surface tension of the liquid or the like, it is difficult for the liquid to flow into the region or to spread out in the region in some cases. On the other hand, in the pattern forming method of the present invention, due to the movement of liquid in the portion where there is a difference in the line width, the functional liquid L is induced to flow into the linear region A or to spread out in the linear region A, enabling prevention of overflow of the functional liquid L from the banks B. In the disposition of the functional liquid L, it is needless to say that the disposition amount of the functional liquid with respect to the linear region A is appropriately set.

In this manner, in the pattern forming method of the present invention, since the functional liquid L is kept from overflowing from the banks B when disposing the functional liquid L, the pattern F is formed accurately in a desired shape. Therefore, the thin linear pattern F can be accurately and stably formed.

Here, in the linear region A sectioned by the banks B, the width Wp of the broad width section As is preferably 110 to 500% of the width W of the other portion. Accordingly, the functional liquid L is reliably kept from overflowing from the banks B when disposing the functional liquid L. If the proportion is less than 110%, there is concern that the functional liquid may not sufficiently escape into the broad width section. Hence this is not desirable. If the proportion is more than 500%, this is also not desirable from the point of effective utilization of the space on the substrate.

The shape of the linear region A is not limited to that shown in FIG. 1 and may be another shape. The number, size, disposition position, and disposition pitch of the broad width section As in the linear region A are appropriately set according to the material or width of the pattern, or the required accuracy.

Figure 2B:
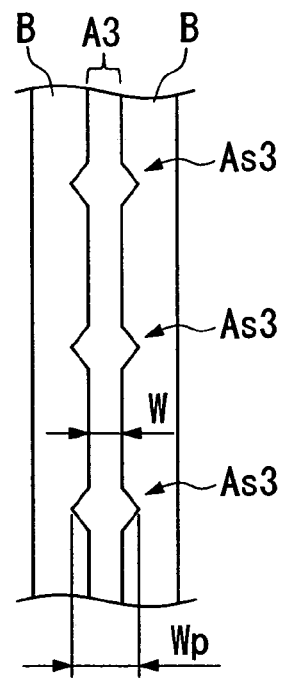

FIG. 2A and FIG. 2B show another examples of the linear region A.

Whereas in the linear region A shown in FIG. 1, the width of the broad width section As is broadened toward both sides of the central axis of the linear region A, in the linear region A2 shown in FIG. 2A, the broad width sections As1 and As2 are broadened toward one side of the central axis of the linear region A2.

Moreover, the broad width section As1 which is broadened toward one side of the central axis along the axial direction of the linear region A2, and the broad width section As2 which is broadened toward the other side are alternatively formed.

Furthermore, while in the linear region A shown in FIG. 1, the edge section of the broad width section As is formed in a rectangular shape, in the linear region A3 shown in FIG. 2B, the edge section of the broad width section As is formed in a triangular shape. The edge section of the broad width section As may be formed in a circular-arc shape.

Figure 3:
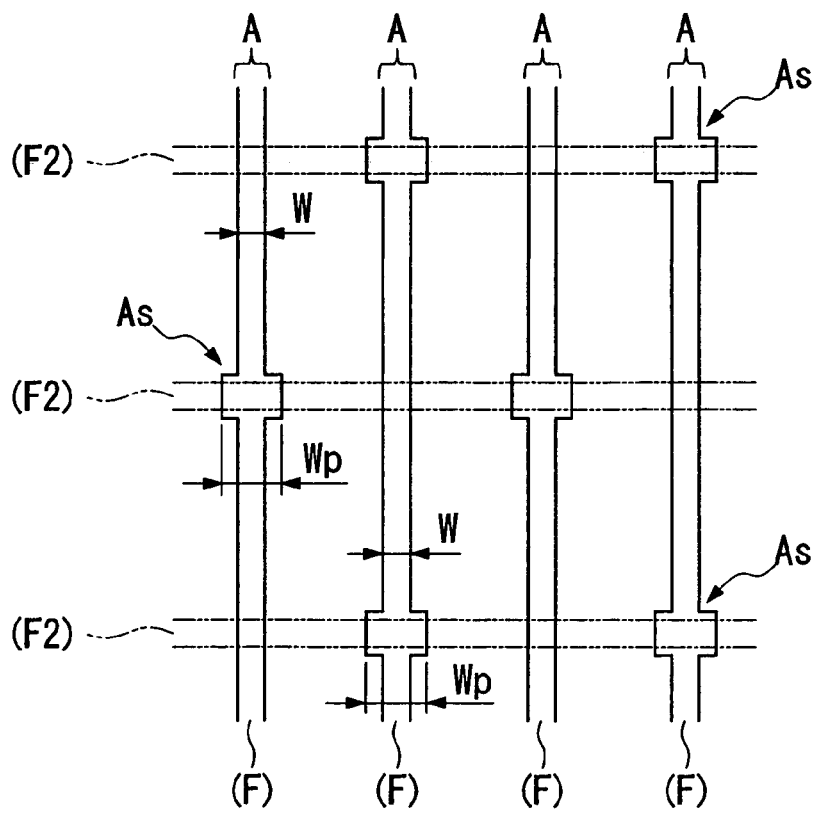
FIG. 3 shows an example of a position where broad width sections are formed in a linear region.

Moreover, FIG. 3 shows an example of the positions where the broad width sections As are formed.

In FIG. 3, the broad width sections As are provided at the part where a pair of patterns (F and F2) cross each other.

That is, the linear region A is formed so that it becomes partially broader in width at a portion crossing over the region where the other pattern F2 is formed. Accordingly, the space on the substrate is effectively utilized. In FIG. 3, for example, the pattern F is used for the gate lines in a TFT structure, and the pattern F2 is used for the source lines (data lines) in the TFT structure.

Figure 4:
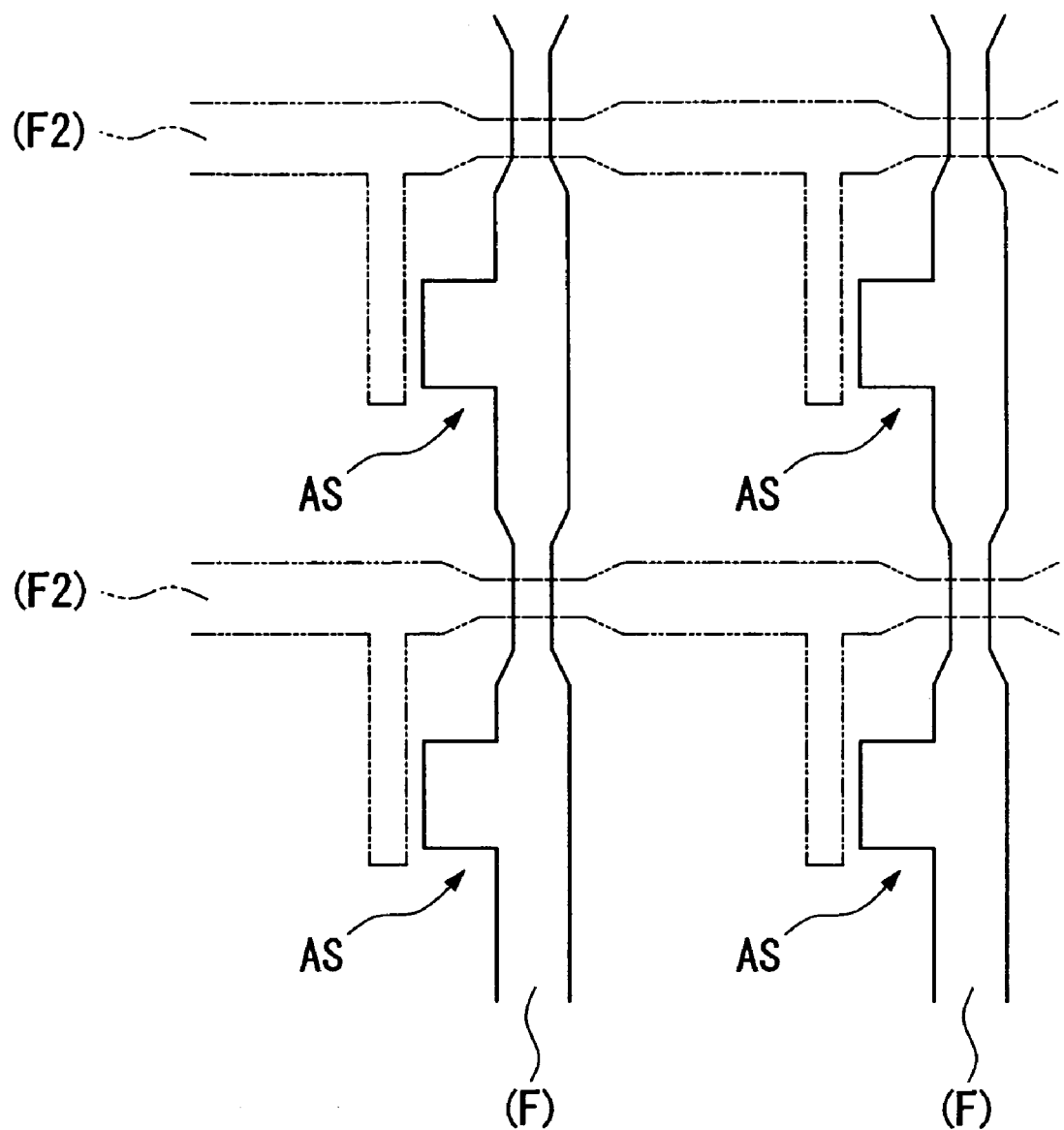
FIG. 4 shows another example of a position where broad width sections are formed in the linear region.

Moreover, FIG. 4 shows another example of the position where the broad width section As is formed.

In FIG. 4, the broad width sections As are provided at the part where the pair of film patterns (F and F2) cross each other. That is, the linear region A is formed so that it becomes partially narrower in width at a portion crossing over the region where the other film pattern F2 is formed. Accordingly, the volume is not accumulated at the crossing section of the film pattern, and the device characteristic can be increased. In FIG. 4, for example, the film pattern F is used for the gate lines in a TFT structure and the film pattern F2 is used for the source lines (data lines) in the TFT structure.

Examples of the substrate P of the present invention include various types of plates such as glass, fused silica, Si wafer, plastic film, metal plate, and the like. Moreover, the examples also include substrates of such various materials formed with a semiconductor film, a metal film, a dielectric film, an organic film and the like, as a ground layer on the surface.

Furthermore, various types are applicable for the functional liquid L in the present invention. For example, an ink for wiring patterning including conductive particles is used.

Moreover, for a method of disposing the functional liquid L onto a region sectioned by the banks B, the droplet discharge method, being a so-called inkjet method is preferably used. The advantage of using the droplet discharge method is that there is less wastage in consumption of liquid material, and the amount and the position of the functional liquid disposed on the substrate can be easily controlled, compared to the other coating techniques such as the spin coating method.

The wiring pattern ink is composed of a dispersing liquid being a dispersion medium with conductive particles dispersed therein, or a solution being a solvent (dispersion medium) with organosilver compounds or silver oxide nanoparticles dispersed therein.

For the conductive particles, for example, metal particles which contain gold, silver, copper, palladium, or nickel, and oxidized substances thereof, a conductive polymer or superconductive particles are used.

To increase the dispersibility of these conductive particles, organic matter may be coated on the surface for use. Examples of the coatings to be coated on the surface of the conductive particles include organic solvents such as xylene, toluene, citric acid, or the like.

The diameter of the conductive particles is preferably above 1 nm and below. 0.1 µm. If it is larger than 0.1 µm, there is concern of clogging at the nozzle of a liquid discharge head described later. If it is smaller than 1 nm, the volume ratio of coating with respect to conductive particles is increased, causing an excessive ratio of organic matter in the film to be obtained.

The dispersion medium is not particularly restricted provided it can disperse the abovementioned conductive particles therein without condensation. For example, the examples include, in addition to water, alcohol such as methanol, ethanol, propanol and butanol, hydrocarbon compounds such as n-heptane, n-octane, decane, decane, dodecane, tetradecane, toluene, xylene, cymene, dulene, indent, dipentene, tetrahydronaphthalene, decahydronaphthalene and cyclohexylbenzene, ether compounds such as ethyleneglycoldimethyl ether, ethyleneglycoldiethyl ether, ethyleneglycolmethylethyl ether, diethyleneglycoldimethyl ether, diethylenglycoldiethyl ether, diethyleneglycolmethylethyl ether, 1,2-dimethoxyethane, bis (2-methoxyethyl)ether, and p-dioxane, and polar compounds such as propylene carbonate, γ-butyrolactone, N-methyl-2-pyrolidone, dimethylformamide, dimethylsulfoxide and cyclohexanone. Among these, water, alcohol, hydrocarbon compounds and ether compounds are preferable in terms of the dispersibility of particles, stability of dispersion liquid, and easy application to the droplet discharge method (inkjet method), where water and hydrocarbon solvents are especially preferable as a dispersion medium.

It is preferable that the surface tension of the dispersing liquid of the abovementioned conductive particles is in the range above 0.02 N/m and below 0.07 N/m. This is because when liquid is discharged using the droplet discharge method, if the surface tension is less than 0.02 N/m, the wettability of the ink composition with respect to the nozzle surface increases so that the discharge direction tends to deviate, and if the surface tension exceeds 0.07 N/m, the shape of the meniscus at the tip of the nozzle becomes unstable, making it difficult to control the discharge amount and the discharge timing. In order to modify the surface tension, a good way is to add a small amount of surface tension modifier such as a fluorine group, silicon group, nonionic group, into the abovementioned dispersing liquid to an extent not to largely decrease the contact angle with the substrate. The nonionic surface tension modifier increases the wettability of liquid on the substrate, improves the leveling property of the film, and helps to prevent the occurrence of minute ruggedness on the film. The abovementioned surface tension modifier may contain organic compounds such as alcohol, ether, ester, ketone, and the like as required.

The viscosity of the abovementioned dispersing liquid is preferably above 1 mPa·s and below 50 mpa·s. This is because when liquid material is discharged in droplet form using the droplet discharge method, if the viscosity is smaller than 1 mPa·s, the area around the nozzle is easily contaminated by discharged ink, and if the viscosity is higher than 50 mPa·s, the frequency of clogging at the nozzle hole increases, making it difficult to smoothly discharge droplets.

Here, discharging techniques of the droplet discharge method include an electrification controlling method, a pressing and vibrating method, an electromechanical converting method, an electro-thermal converting method, an electrostatic attracting method, and the like. In the electrification controlling method, an electric charge is applied to a material by an electrification electrode and the discharge direction of the material is controlled by a deflecting electrode to discharge from the nozzle. Moreover, in the pressing and vibrating method, a super-high pressure of about 30 kg/cm$^2$ is applied to a material to discharge the material from the tip of the nozzle. If a control voltage is not applied, the material goes straight and is discharged from the nozzle. If the control voltage is applied, due to an electrostatic repulsion generated between the materials, the materials are dispersed and are not discharged from the nozzle. In the electrothermal converting method, the property where a piezo device (piezoelectric element) deforms on receiving a pulsed electric signal is used, and due to the deformation of the piezo device, a pressure is applied to a space storing a material, through a flexible substance so as to push the material out of this space and discharge it from the nozzle.

Furthermore, in the electrothermal converting method, the material is rapidly gasified so as to generate bubbles by a heater provided in a space storing the material, so that the material in the space is discharged by the pressure of the bubbles. In the electrostatic attracting method, a micropressure is applied into a space storing the material and a meniscus of the material is formed in the nozzle, in which state an electrostatic attractive force is applied so as to draw the material out. In addition to these methods, such techniques as a method of using a viscosity variation of a fluid due to an electric field, and a method of blowing the material out by an electric discharge spark, are also applicable. The advantage of the droplet discharge method is that waste of the material in use is less, and the desired amount of material can be surely disposed in the desired position. The amount of one drop of liquid material (fluid body) discharged by the droplet discharge method is for example 1 to 300 ng (nanogram).

In the pattern forming method of the present invention, a pattern having conductivity can be formed by using the abovementioned wiring pattern ink. This conductive pattern may be applied to various devices as wiring.

Figure 5:
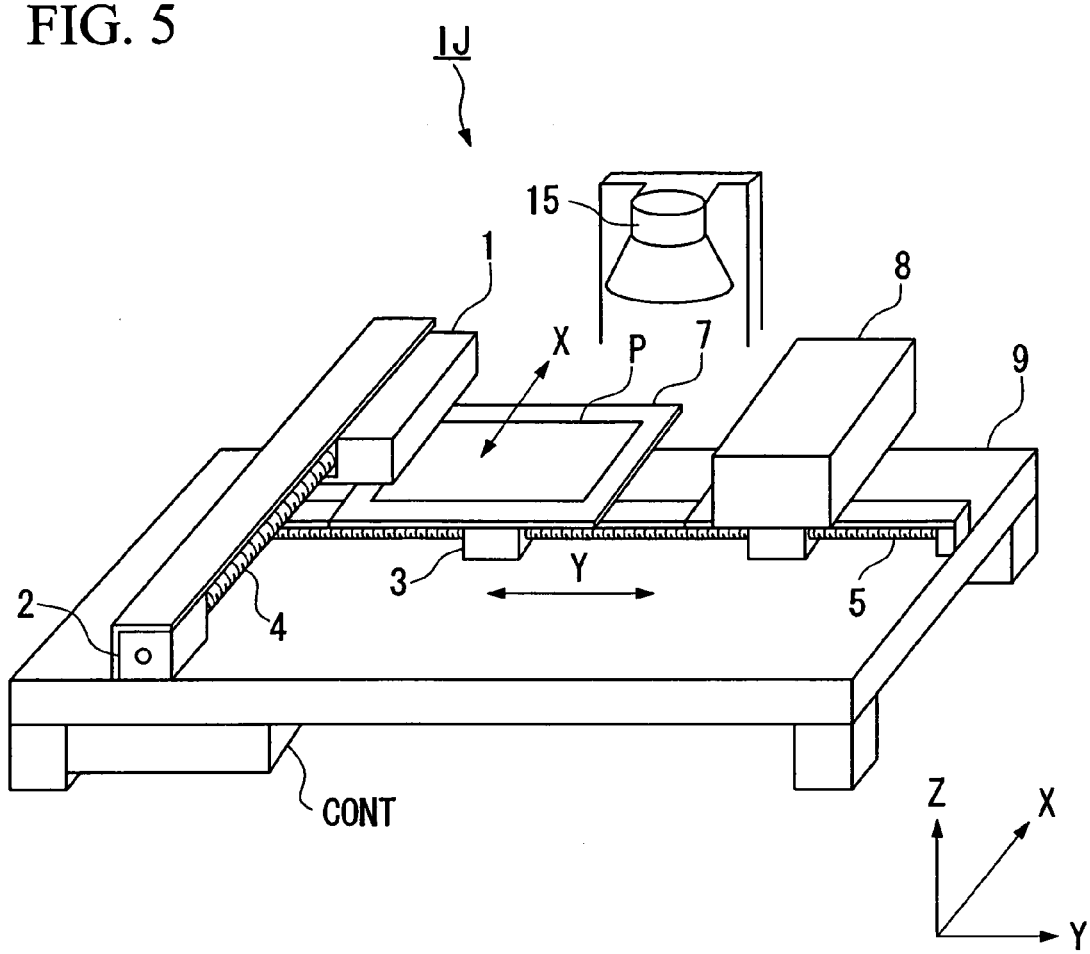
FIG. 5 is a schematic perspective view of a droplet discharge apparatus.

FIG. 5 is a perspective view showing a schematic diagram of a droplet discharge apparatus (inkjet apparatus) IJ which arranges a liquid material on to a substrate by the droplet discharge method, as an example of an apparatus used for the pattern forming method of the present invention.

The droplet discharge apparatus IJ includes; a droplet discharge head 1, an X direction driving shaft 4, a Y direction guide shaft 5, a controller CONT, a stage 7, a cleaning mechanism 8, a base 9, and a heater 15.

The stage 7 is for supporting a substrate P on which an ink (liquid material) is provided by this droplet discharge apparatus IJ, and includes a fixing mechanism (not shown) which fixes the substrate P at a reference position.

The droplet discharge head 1 is a multi-nozzle type droplet discharge head equipped with a plurality of discharge nozzles having a longitudinal direction matching the X axis direction. The plurality of discharge nozzles are provided and disposed in constant intervals in the Y axis direction on the lower surface of the droplet discharge head 1. An ink containing the abovementioned conductive particles is discharged from the discharge nozzles of the droplet discharge head 1 onto the substrate P supported by the stage 7.

To the X direction driving shaft 4, an X direction driving motor 2 is connected. The X direction driving motor 2 is a stepping motor or the like, which rotates the X direction driving shaft 4 when a driving signal for the X axis direction is supplied from the controller CONT. When the X direction driving shaft 4 rotates, the droplet discharge head 1 moves in the X axis direction.

The Y direction guide shaft 5 is fixed so as to not move relative to the base 9. The stage 7 includes a Y direction driving motor 3. The Y direction driving motor 3 is a stepping motor or the like, which moves the stage 7 in the Y axis direction when a Y axis direction driving signal is supplied from the controller CONT.

The controller CONT supplies a voltage for droplet discharge control to the droplet discharge head 1. The controller CONT also supplies a driving pulse signal which controls the movement of the droplet discharge head 1 in the X axis direction, to the X direction driving motor 2, and supplies a driving pulse signal which controls the stage 7 in the Y axis direction, to the Y direction driving motor 3.

The cleaning mechanism 8 is for cleaning the droplet discharge head 1. The cleaning mechanism 8 includes a Y direction driving motor (not shown). By the driving of this Y direction driving motor, the cleaning mechanism moves along the Y direction guide shaft 5. The movement of the cleaning mechanism 8 is also controlled by the controller CONT.

The heater 15 is here a device for heat treatment of the substrate P by lamp annealing, which evaporates and dries the solvent included in a liquid material coated on the substrate P. Power ON/OFF of this heater 15 is also controlled by the controller CONT.

The droplet discharge apparatus IJ discharges droplets onto the substrate P while relatively scanning the stage 7 supporting the droplet discharge head 1 and the substrate P. Here, in the description hereunder, the disposition is such that the X axis direction is the scanning direction and the Y axis direction orthogonal to the X axis direction is the non-scanning direction. Therefore, the discharge nozzles of the droplet discharge head 1 are provided and disposed in constant intervals in the Y axis direction which is the non-scanning direction. In FIG. 1, the droplet discharge head 1 is disposed at a right angle with respect to the running direction of the substrate P. However, the disposition may be such that the angle of the droplet discharge head 1 is adjusted to cross with respect to the running direction of the substrate P. If this is done, the pitch between nozzles may be adjusted by adjusting the angle of the droplet discharge head 1. Moreover, the disposition may be such that the distance between the substrate P and the nozzle surface can be arbitrarily adjusted.

Figure 6:
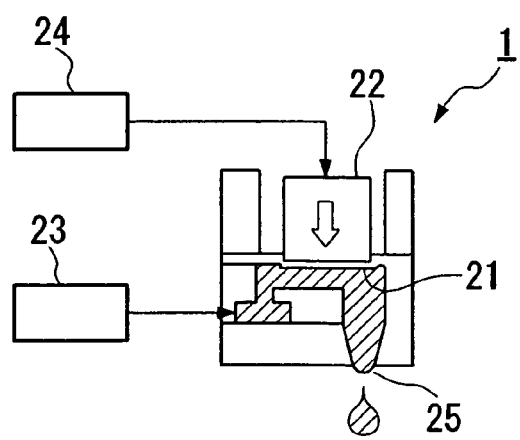
FIG. 6 is a diagram for explaining the principle of discharging a liquid by a piezo method.

FIG. 6 is a diagram for explaining the principle of discharging a liquid material by a piezo method.

In FIG. 6, a piezo device 22 is installed adjacent to a liquid chamber 21 which accommodates a liquid material (wiring pattern ink, functional liquid). The liquid material is supplied into the liquid chamber 21 via a liquid material supplying system 23 including a material tank which accommodates the liquid material.

The piezo device 22 is connected to a driving circuit 24. A voltage is applied to the piezo device 22 through this driving circuit 24 so as to deform the piezo device 22, so that the liquid chamber 21 is deformed to discharge the liquid material from the nozzle 25. In this case, the amount of distortion of the piezo device 22 is controlled by changing the value of the applied voltage. Moreover, the speed of distortion of the piezo device 22 is controlled by changing the frequency of the applied voltage.

The advantage of the droplet discharge by the piezo method is that the material is not heated so that the composition of material is not affected.

Next is a description of a method of forming a conductive film wiring on a substrate, as an example of an embodiment of a wiring pattern forming method of the present invention, with reference to FIG. 7A to FIG. 7E.

The pattern forming method according to the present embodiment is to arrange the abovementioned wiring pattern ink (wiring pattern forming material) on the substrate so as to form a conductive pattern for wiring, on the substrate, and generally includes; a bank forming step, a residue disposing step, a repellent treatment step, a material disposing step and intermediate drying step, and a baking step.

Hereunder is a detailed description of the respective steps.

(Bank Forming Step)

Figure 7A:
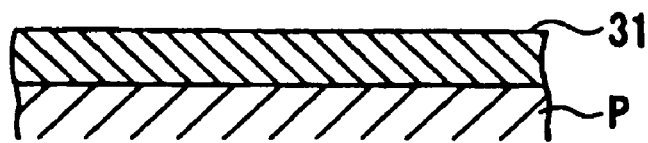
FIG. 7A to FIG. 7E show a procedure for forming a wiring pattern.

A bank is a member which functions as a partition member. The bank may be formed by any method such as a lithography method, a printing method or the like. For example, if the lithography method is used, then by a predetermined method such as spin coating, spray coating, roll coating, dye coating, dip coating or the like, as shown in FIG. 7A, a bank forming material 31 is coated onto a substrate P to match the height of the bank, and a resist layer is coated thereon. Then, a mask is applied matching the shape of the bank (wiring pattern) and the resist is exposed and developed so as to leave the resist matching the shape of the bank. Finally, the bank material of the rest of the mask portion is removed by etching. Moreover, a bank (ridge section) may be formed from two or more layers composed of a lower layer of an organic or inorganic material which is lyophilic with respect to the functional liquid and an upper layer of an organic material which shows repellency.

Figure 7B:
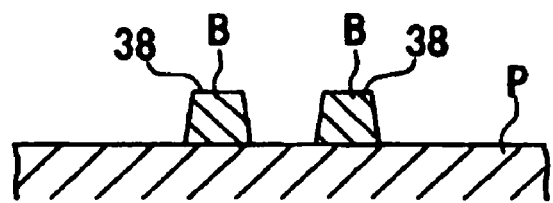

Therefore, as shown in FIG. 7B, banks B are protrudingly formed for example, in 15 µm width so as to enclose the periphery of a region on which the wiring pattern is to be formed.

Moreover, in the present invention, as shown in the abovementioned FIG. 1, a linear region is formed by banks, and broad width sections having broader width compared to the width of other regions are formed in a predetermined position in relation to the axial direction of this linear region.

Prior to coating the organic material, HMDS treatment (a method of making $(CH_3)_3SiNHSi(CH_3)_3$ into vapor form for coating) is applied onto the substrate P for surface reforming treatment (not shown in FIG. 7A to FIG. 7E).

(Residue Disposing Step (Attractive Treatment Step))

Next, a residue disposing treatment is performed on the substrate P so as to remove resist (organic matter) residues between the banks from when forming the banks.

For the residue disposing treatment, an ultraviolet (UV) radiation treatment which disposes of the residue by irradiating ultraviolet, an $O_2$ plasma treatment which uses oxygen as a treatment gas in the atmospheric air, and the like may be selected. However, the $O_2$ plasma treatment is performed here.

Specifically, it is performed by irradiating oxygen in plasma state from a plasma discharging electrode. The condition of the $O_2$ plasma treatment is such that, for example, the plasma power is 50 to 1000 W, the oxygen gas flow rate is 20 to 100 ml/min, the conveyance speed of the substrate P with respect to the plasma discharging electrode is 0.5 to 10 mm/sec and the temperature of the substrate is 70 to 90° C.

If the substrate P is a glass substrate, the surface is attractive with respect to a wiring pattern forming material. However, similarly to the present embodiment, by performing the $O_2$ plasma treatment or the ultraviolet radiation treatment for disposing residues, the surface of the substrate may be made more attractive.

(Repellent Treatment Step)

Subsequently, the repellent treatment is performed on the bank B so as to impart repellency to the surface.

For the repellent treatment, for example, a plasma treatment method which uses tetrafluoromethane as a treatment gas in atmospheric air ($CF_4$ plasma treatment method) may be adopted. The condition of the $CF_4$ plasma treatment is such that, for example, the plasma power is 50 to 1000 W, the tetrafluoromethane gas flow rate is 50 to 100 ml/min, the substrate conveyance speed with respect to the plasma discharging electrode is 0.5 to 10 mm/sec, and the temperature of the substrate is 70 to 90° C.

The treatment gas is not limited to tetrafluoromethane (carbon tetrafluoride) and other gas of fluorocarbon may be used.

By performing such repellent treatment, a fluorine group is introduced into the resin constituting the banks B so as to impart a high repellency. The abovementioned $O_2$ plasma treatment as the attraction treatment may be performed prior to forming the banks B. However due to the property that the banks B are more easily fluorinated (made repellent) after pretreatment by $O_2$ plasma, the $O_2$ plasma treatment is preferably performed after forming the banks B.

Due to the repellent treatment on the banks B, there may be a slight effect on the surface of the substrate P on which the attractive treatment is previously performed. However, particularly in the case where the substrate P is composed of glass or the like, the fluorine group is not introduced by the repellent treatment, so that the attractive property, that is the wettability of the substrate P, is not substantially compromised.

Moreover, the banks B may be formed from a repellent material (for example, resin material having a fluorine group) so as to omit the repellent treatment.

(Material Disposing Step and Intermediate Drying Step)

Next, using the droplet discharge method by the droplet discharge apparatus IJ shown in FIG. 5, the wiring pattern forming material is disposed in a region sectioned by the banks B, that is between the banks B, on the substrate P. In the present example, a dispersing liquid being a solvent (dispersion medium) with conductive particles dispersed therein is discharged as the wiring pattern ink (functional liquid L). For the conductive particles used here, metal particles which contain gold, silver, copper, palladium, or nickel, and a conductive polymer or superconductive particles are used.

Figure 7C:
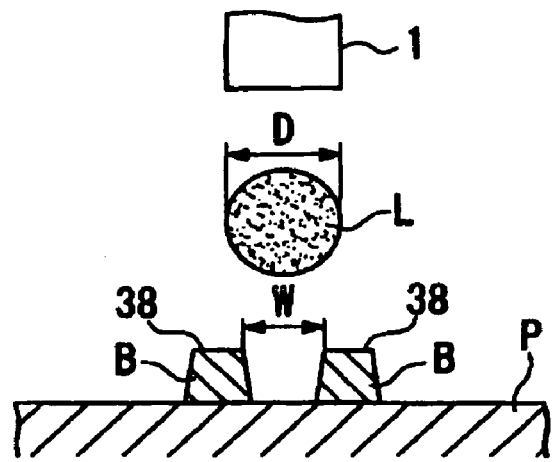

That is, in the material disposing step, as shown in FIG. 7C, the functional liquid L is discharged from the liquid discharge head 1 in the form of droplet, and the droplet is disposed between the banks B on the substrate P. The condition of the droplet discharge is such that for example, the ink weight is 7 ng/dot and the ink speed (discharge speed) is 5 to 7 m/sec.

At this time, since the region for disposing the functional liquid is partitioned by the banks B, the functional liquid L is kept from spreading out on the substrate P.

Figure 7D:
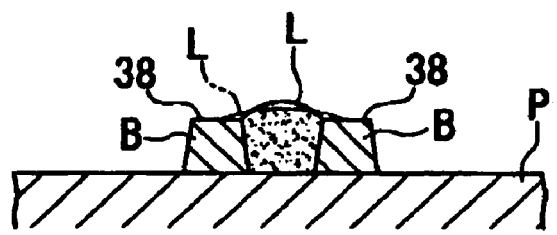

Moreover, as shown in FIG. 7C., in the case where the width W between the adjacent banks B is narrower than the diameter D of the droplet (that is, the diameter D of the droplet is greater than the width W between the adjacent banks B), then as shown by a two-dot chain line in FIG. 7D, the droplet is partially placed on the top of the banks B. However, the functional liquid L flows into between the banks B due to the capillary phenomenon. Since the banks B are made repellent in the present example, the functional liquid is repelled by the banks B and surely goes into between banks B.

Moreover, since the surface of the substrate P is made attractive, the functional liquid L which flows into between banks B spreads evenly out within the sectioned region. Therefore, a coating film having a smaller line width W than the diameter D of the droplet being discharged is formed.

Furthermore, in the present invention, as shown in the abovementioned FIG. 1, since the width of the linear region is partially formed in a broad width, then when disposing the functional liquid, part of the functional liquid escapes into this broad width section, enabling prevention of overflow of the functional liquid from the banks, and promoting spreading out in the region.

(Intermediate Drying Step)

After disposing the functional liquid onto the substrate P, a drying treatment (intermediate drying) is performed as necessary for removing the dispersion medium and ensuring the film thickness. The drying treatment may be performed by a treatment, for example, using a normal hot plate, an electric furnace, or the like which heats up the substrate P, or by means of lamp annealing.

The light source of the light used for lamp annealing is not particularly limited. However an infrared lamp, a xenon lamp, a YAG laser, an argon laser, a carbon dioxide gas laser, and excimer lasers such as XeF, XeCl, XeBr, KrF, KrCl, ArF and ArCl may be used as the light source. These light sources are generally used in an output range of above 10 W and below 5000 W. However one in a range of above 100 W and below 1000 W is sufficient for the present embodiment.

(Baking Step)

Regarding the dried film after the discharging step, it is necessary to completely remove the dispersion medium so as to increase the electrical contact between particles. Moreover, in the case where a coating material such as organic matter is coated on the surface of these conductive particles in order to increase the dispersibility, it is also necessary to completely remove this coating material. For this purpose, the heat treatment and/or light treatment is performed on the substrate after the discharging step.

The heat treatment and/or light treatment is normally performed in air. However it may be performed in an inert gas atmosphere such as nitrogen, argon and helium. The temperature of the heat treatment and/or light treatment is appropriately determined considering the boiling point (vapor pressure) of the dispersion medium, the kind and the pressure of the atmosphere gas, the thermal behavior such as the dispersibility or the oxidizability of the microparticles, the presence/absence of coatings, and the heat resistant temperature of the base material.

For example, it is necessary to bake at a temperature of about 300° C. so as to remove the coating material composed of organic matter. In this case, for example, a low melting glass may be formed on the banks B or the dried film of the functional liquid.

Moreover, if a plastic substrate is used, it is preferably baked at a temperature of above room temperature and below 100° C.

Figure 7E:
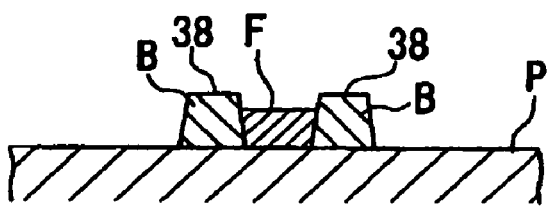

By the abovementioned steps, regarding the dried film after the discharging step, electrical contact between particles can be ensured, and this can be converted into the conductive film (pattern F) as shown in FIG. 7E.

As described above, in the pattern forming method of the present example, since the width of the linear region sectioned by the banks is partially formed in a broad width, the functional liquid can be surely kept from overflowing from the banks, and induced to spread out in the linear region. Accordingly, the thin linear pattern can be accurately and stably formed.

SECOND EMBODIMENT

Figure 8:
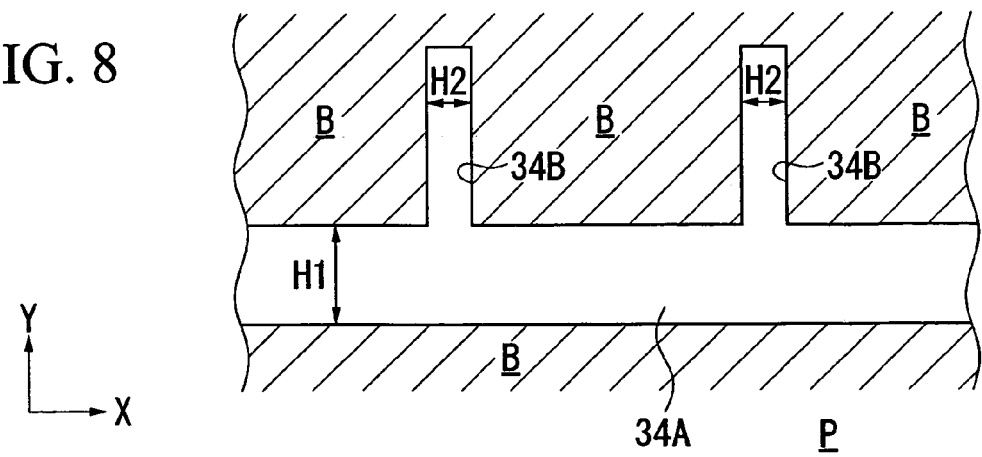
FIG. 8 shows another example of a wiring pattern forming method.

Next is a description of a second embodiment of a wiring pattern forming method of the present invention, with reference to FIG. 8.

FIG. 8 is a schematic diagram for explaining the wiring pattern forming method according to the present embodiment. Here, in the following description, the same reference symbols are used for components the same or equivalent to those in the abovementioned embodiment, and description thereof is simplified or omitted.

In FIG. 8, on a substrate P, a first ditch section 34A (broad width section) having a first width H1 due to the banks B, and a second ditch section 34B (narrow width section) for connecting with the first ditch section 34A and having a second width H2 are formed. The first width H1 is formed larger than the diameter of the functional liquid in flight. The second width H2 is narrower than the first width H1. In other words, the second width H2 is less than the first width H1. Moreover, the first ditch section 34A is formed to extend in the X axis direction in FIG. 8, and the second ditch section 34B is formed to extend in the Y axis direction which is different from the X axis direction.

Figure 9A:
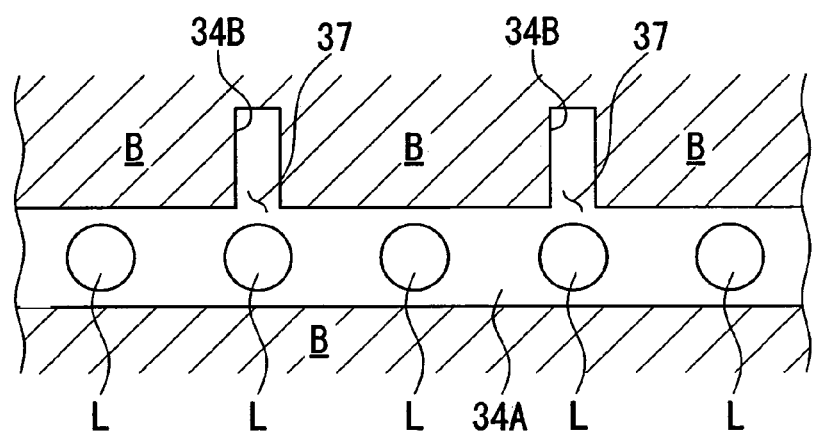
FIG. 9A and FIG. 9B show another example of the wiring pattern forming method.

In order to form the pattern F in the abovementioned ditch sections 34A and 34B, firstly as shown in FIG. 9A, droplets of functional liquid L containing the wiring pattern ink for forming the pattern F are disposed in predetermined positions of the first ditch section 34A by the droplet discharge head 1. When disposing the droplets of functional liquid L in the first ditch section 34A, the droplets are discharged from the above of the first ditch section 34A into the first ditch section 34A using the droplet discharge head 1. In the present embodiment, as shown in FIG. 9A, the droplets of functional liquid L are disposed at predetermined intervals along the longitudinal direction of the first ditch section 34A (X axis direction). At this time, the droplets of functional liquid L are also disposed in the vicinity of connecting sections 37 (crossing region) where the first ditch section 34A and second ditch sections 34B are connected in the first ditch section 34A.

Figure 9B:
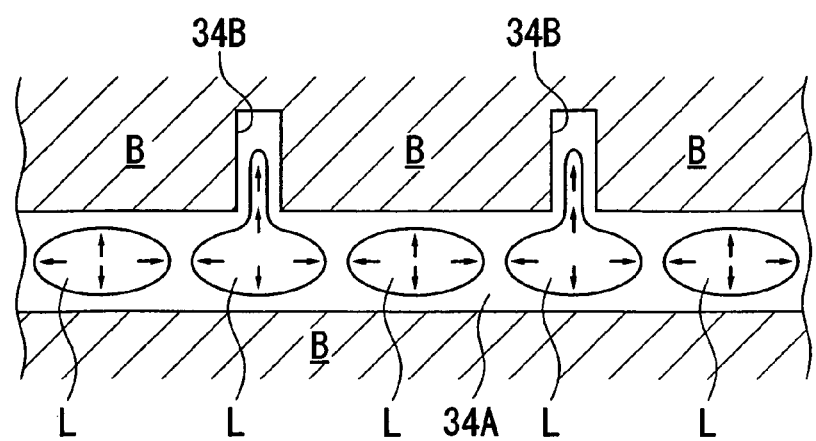

As shown in FIG. 9B, the functional liquid L disposed in the first ditch section 34A becomes wet to spread out within the first ditch section 34A due to self flowing. Furthermore, the functional liquid L disposed in the first ditch section 34A becomes wet to also spread out to the second ditch sections 34B due to self flowing. Accordingly, even though the droplets are not discharged to the second ditch sections 34B from directly above the second ditch sections 34B, the functional liquid L can be also disposed into the second ditch sections 34B.

In this way, by disposing the functional liquid L into the first ditch section 34A, due to the self flowing (capillary phenomenon) of the functional liquid L disposed in the first ditch section 34A, the functional liquid L can be also disposed into the second ditch sections 34B. Accordingly, even though the droplets of functional liquid L are not discharged to the second ditch sections 34B having narrow width H2, from above of the banks B, by discharging the droplets of functional liquid L onto the first ditch section 34A having the broad width H1, the functional liquid L can be smoothly disposed into the second ditch sections 34B. Particularly, even in the case where the width H2 of the second ditch section 34B is narrow and the diameter of a droplet discharged from the droplet discharge head 1 (the diameter of the droplet in flight) is smaller than the width H2, due to self flowing of the functional liquid L, the functional liquid L can be smoothly disposed into the second ditch sections 34B. Moreover, since the width H2 of the second ditch section 34B is narrow, then due to the capillary phenomenon, the functional liquid L can be smoothly disposed into the second ditch sections 34B. Therefore, a pattern having a desired shape can be formed. Furthermore, since the functional liquid L can be smoothly disposed into the second ditch sections 34B having narrow width, the pattern can be made finer with a thinner line. On the other hand, since the width H1 of the first ditch section 34A is broad, then even if droplets of functional liquid L are discharged from the above of the banks B to the first ditch section 34A, it is possible to avoid the situation where part of the functional liquid L is splashed on the top surface 38 of the bank B and remains as residue. Therefore, a pattern F demonstrating the desired characteristics can be stably formed.

Moreover, according to the present embodiment, of the first ditch section 34A, the functional liquid L is disposed in the vicinity of the connecting sections 37 where the first ditch section 34A and second ditch sections 34B are connected. Therefore, the functional liquid L can be easily made flow into the second ditch sections 34B when being wet to spread out, and it becomes possible to arrange the functional liquid L more smoothly into the second ditch sections 34B.

After disposing the functional liquid L into the first ditch section 34A and the second ditch sections 34B, similarly to the abovementioned first embodiment, the pattern F can be formed by undergoing the intermediate drying step and the baking step.

Figure 10:
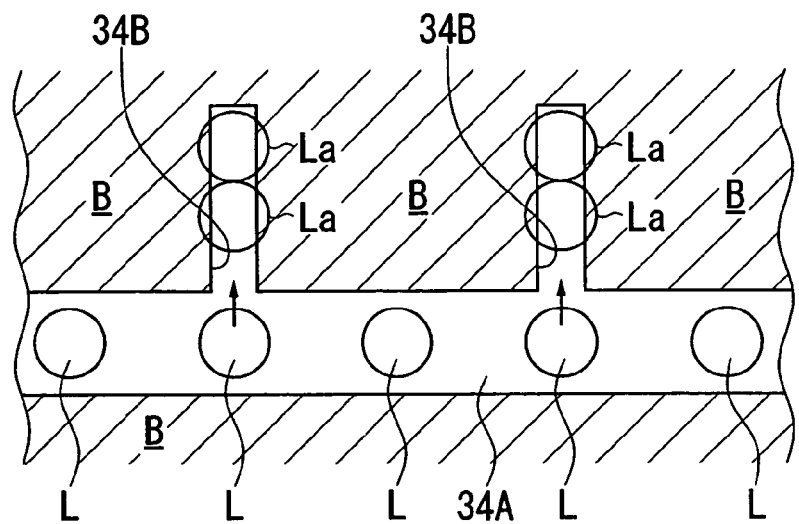
FIG. 10 shows another example of the wiring pattern forming method.

As shown in FIG. 10, functional liquid La composed of only the solvent of the functional liquid may be discharged and disposed in the second ditch sections 34B, and then the functional liquid L may be disposed as described above. In this manner, by discharging and disposing the functional liquid La into the second ditch sections 34B, the functional liquid L may easily flows into the second ditch sections 34B so that the functional liquid L can be disposed into the second ditch sections 34B more smoothly. Since the functional liquid La does not contain conductive particles, it is not conductive. Consequently, even in the case where a residue of the functional liquid L remains on the bank B, the desired characteristic of pattern F is unchanged.

Moreover, after disposing the functional liquid L, a vacuum drying step may be performed. Since the functional liquid L is vacuum extracted by performing the vacuum drying step, then in this case also it becomes possible to arrange the functional liquid L more smoothly into the second ditch sections 34B.

Furthermore, after disposing the functional liquid L, a gas may be blown onto the functional liquid L toward the second ditch sections 34B. In this manner, by blowing the gas onto the functional liquid L toward the second ditch sections 34B, the functional liquid L easily flows into the second ditch sections 34B. Therefore, in this case also it becomes possible to arrange the functional liquid L more smoothly into the second ditch sections 34B.

Figure 11:
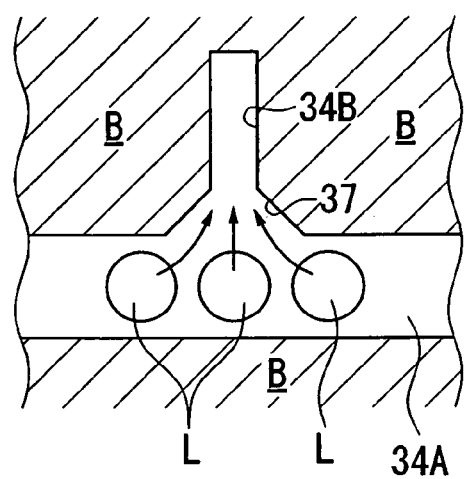
FIG. 11 shows another example of the wiring pattern forming method.

As shown in FIG. 11, the connecting section 37 of the first ditch section 34A and the second ditch section 34B may be in a tapered shape which gradually becomes narrower from the first ditch section 34A toward the second ditch section 34B. Consequently, the functional liquid L disposed into the first ditch section 34A can smoothly flow into the second ditch sections 34B.

Figure 12:
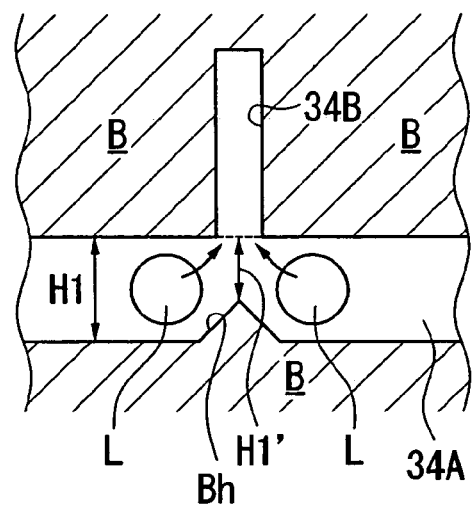
FIG. 12 shows another example of the wiring pattern forming method.

Moreover, as shown in FIG. 12, in a form where the extension direction of the first ditch section 34A and the extension direction of the second ditch sections 34B cross each other, a width H1' of the first ditch section 34A in the vicinity of the second ditch section 34B may be made locally narrower than a width H1 of the other region. Consequently, the functional liquid L disposed into the first ditch section 34A can flow smoothly into the second ditch section 34B. In this case, by making an inner wall face Bh of the bank B forming the first ditch section 34A inclined toward the second ditch section 34B, the functional liquid L disposed into the first ditch section 34A can be made to flow more smoothly into the second ditch sections 34B.

Figure 13A:
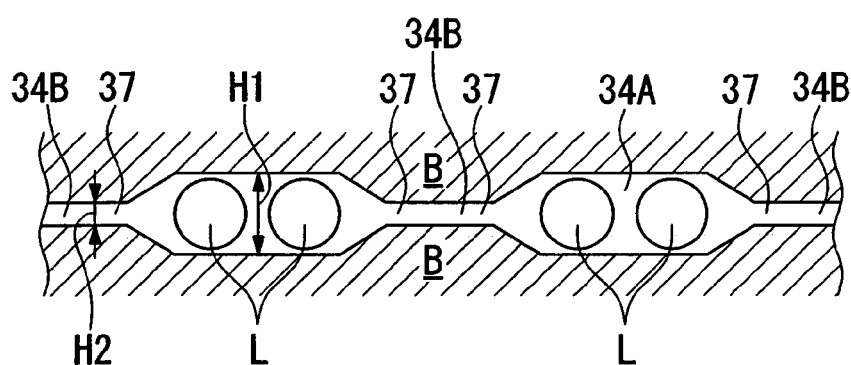
FIG. 13A and FIG. 13B show another example of the wiring pattern forming method.
Figure 13B:
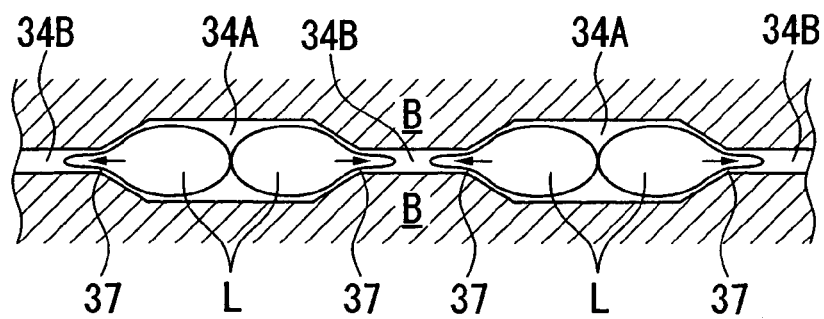

In the respective embodiments described above, the extension direction of the first ditch section 34A having the broad width H1 and the extension direction of the second ditch sections 34B having the narrow width H2 are different to each other. However as shown in FIG. 13A and FIG. 13B, the extension direction of the first ditch section 34A having the broad width H1 and the extension direction of the second ditch sections 34B having the narrow width H2 may be the same. In this case, as shown in FIG. 13A, by disposing the functional liquid L into the first ditch section 34A, as shown in FIG. 13B, the functional liquid L can be disposed into the second ditch sections 34B due to the self flowing of the functional liquid L. Moreover, in this case, by making the connecting section 37 of the first ditch section 34A and the second ditch section 34B in a tapered shape which gradually becomes narrower from the first ditch section 34A toward the second ditch section 34B, the functional liquid L disposed into the first ditch section 34A can flow smoothly into the second ditch sections 34B.

Figure 14:
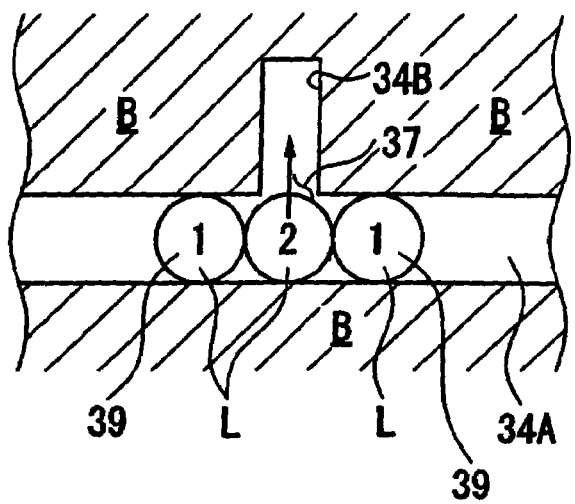
FIG. 14 shows another example of the wiring pattern forming method.

Moreover, when the functional liquid L disposed into the first ditch section 34A is disposed into the second ditch sections 34B due to the self flowing, then as shown in FIG. 14, embankment sections 39 are preferably provided in the area except for the connecting sections 37 of the first ditch section 34A where the first ditch section 34A and the second ditch sections 34B are connected. The embankment sections 39 in FIG. 14 are droplets of the functional liquid L disposed into the first ditch section 34A. That is, the droplet of the functional liquid L used for the embankment section 39 does not flow to the second ditch section 34B but is initially disposed to enclose the vicinity of the connecting sections 37 (crossing region) of the first ditch section 34A where the first ditch section 34A and second ditch sections 34B are connected. In FIG. 14, the droplets and initially disposed and functioning as the embankment sections 39 and initially disposed are denoted by "1". Moreover, the functional liquid L for disposing into the second ditch section 34B due to self flowing is disposed between the connecting section 37 and the embankment sections 39. This droplet is denoted by "2". In this way, the droplet "2" of the functional liquid L disposed between the connecting section 37 and the embankment sections 39 (droplets "1") is blocked to flow in any other direction except for the direction to the connecting section 37, and therefore flows to the connecting section 37 side. Accordingly, the flowing quantity of functional liquid L toward the second ditch section 34B can be increased, and the droplet "2" can smoothly flow into the second ditch section 34B through the connecting section 37.

Figure 15:
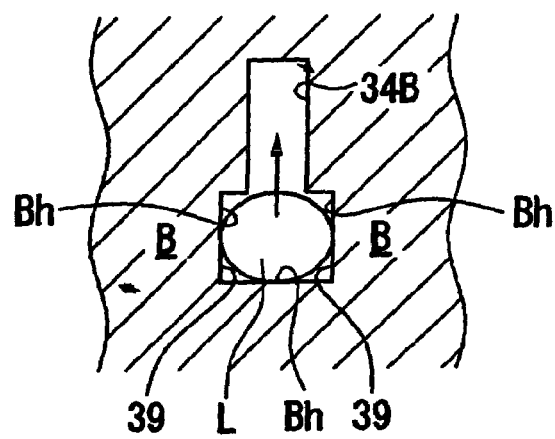
FIG. 15 shows another example of the wiring pattern forming method.

Furthermore, as shown in FIG. 15, an inner wall face Bh of the bank B may be used as the embankment section 39.

Figure 16:
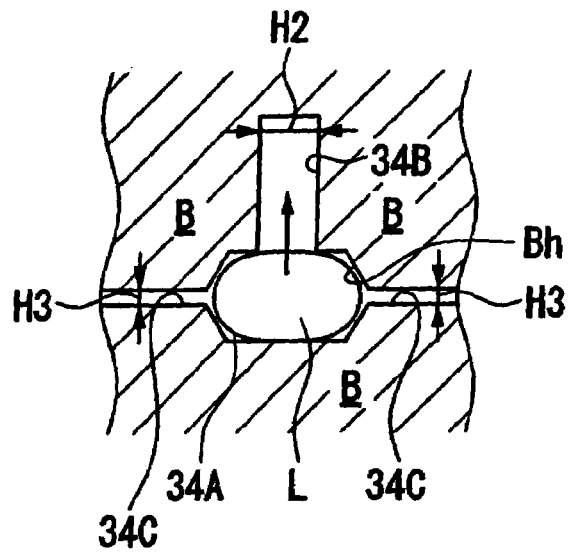
FIG. 16 shows another aspect of the wiring pattern forming method.

Furthermore, as shown in FIG. 16, in the form where the third ditch sections 34C having the narrower width H3 than the width H1 of the first ditch section 34A and the width H2 of the second ditch section 34B, is connected to the first ditch section 34A, the inner wall face Bh of the bank B functions as the embankment section 39, so that the functional liquid L disposed into the first ditch section H1 can smoothly flow into the second ditch section 34B and the third ditch sections 34C.

(Thin Film Transistor)

Figure 17:
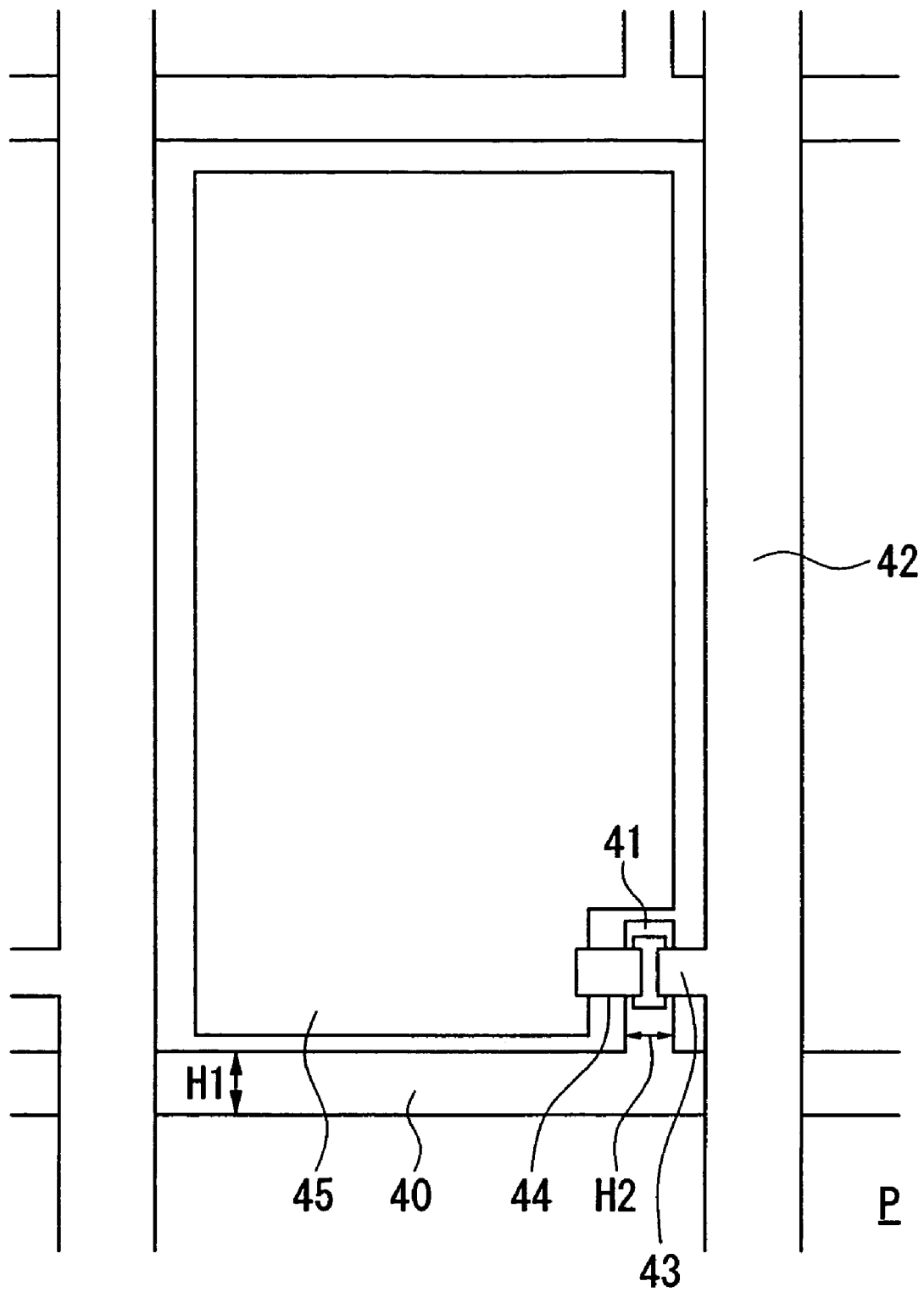
FIG. 17 is a schematic diagram showing an example of a substrate having a thin film transistor.

The wiring pattern forming method of the present invention is applicable when forming a thin film transistor (TFT) as a switching element as shown in FIG. 17, and a wiring for connection thereto. In FIG. 17, on a TFT substrate P having the TFT, a gate wiring 40, a gate electrode 41 which electrically connects to this gate wiring 40, a source wiring 42, a source electrode 43 which electrically connects to this source wiring 42, a drain electrode 44, and a pixel electrode 43 which electrically connects to the drain electrode 44 are provided. The gate wiring 40 is formed so as to extend in the X axis direction and the gate electrode 41 is formed so as to extend in the Y axis direction. The width H2 of the gate electrode 41 is narrower than the width H1 of the gate wiring 40. The gate wiring 40 and the gate electrode 41 may be formed by the wiring pattern forming method according to the present invention.

Moreover, in the above embodiment, the gate wiring of TFT (thin film transistor) is formed using the pattern forming method according to the present invention. However, it is also possible to manufacture other components such as the source electrode, drain electrode, pixel electrode, and the like. Hereunder is a description of methods for manufacturing the TFT, with reference to FIG. 18A to FIG. 18D.

As shown in FIG. 18, firstly, on the top surface of a washed glass substrate 610, first layer banks 611 for providing a ditch 611a of ½₀ to ½₀ times one pixel pitch, are formed based on the photolithography method. These banks 611 should be optically transparent and repellent after being formed. For the material, polymeric materials such as acrylic resin, polyimide resin, olefin resin, and melamine resin may be suitably used.

In order to give repellency to these banks 611 after being formed, it is necessary to perform $CF_4$ plasma treatment (plasma treatment using a gas containing a fluorine component). However instead, repellent components (such as fluorine group components) may be previously filled into the material itself of the banks 611. In this case, the $CF_4$ plasma treatment may be omitted.

It is preferable to ensure that the contact angle of the banks 611 made repellent in the above manner, with respect to the discharge ink is above 40° and the contact angle of the glass surface is below 10°. That is, from results confirmed by examination by the present inventors, for example, a contact angle after treatment, with respect to conductive particles (tetradecane solvent) can be ensured at about 54.0° if an acrylic resin or the like is used for the material of the bank 611 (below 10° in the case without the treatment). This contact angle was obtained under a treatment condition where the tetrafluoromethane gas was supplied at a flow rate of 0.1 mL(liter)/min under a plasma power of 550 W.

In a gate scanning electrode forming step following the abovementioned first layer bank forming step, by discharging droplets containing conductive material by the inkjet to fill in the ditch 611a which is the drawing region sectioned by the banks 611, gate scanning electrodes 612 are formed. When forming the gate scanning electrodes 612, the pattern forming method according to the present invention is applied.

For the conductive material at this time, Ag, Al, Au, Cu, palladium, Ni, W-si, and a conductive polymer may be suitably employed. Regarding the gate scanning electrodes 612 formed in this manner, since the banks 611 are previously imparted with sufficient repellency, a fine wiring pattern can be formed without overflowing beyond the ditch 611a.

By the abovementioned steps, on the substrate 610, a first conductive layer A1 having a flat top surface having the banks 611 and the gate scanning electrodes 612 is formed.

Figure 18A:
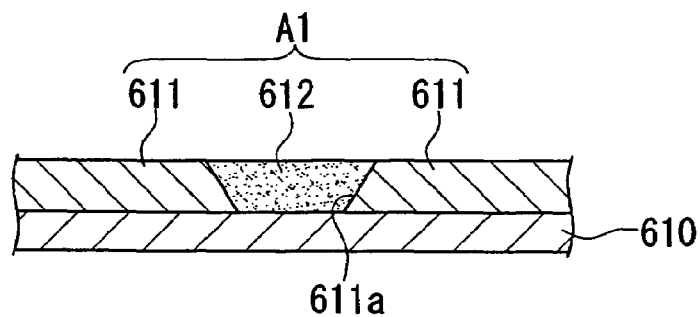
FIG. 18A to FIG. 18D are diagrams for explaining the steps of manufacturing a thin film transistor.

Moreover, in order to obtain a good result in discharging into the ditch 611a, as shown in FIG. 18A, a divergent taper (a taper shape opening in a direction towards the discharge source) is preferably employed for the shape of the ditch 611a. Therefore, the discharged droplets can enter sufficiently deeply inside.

Figure 18B:
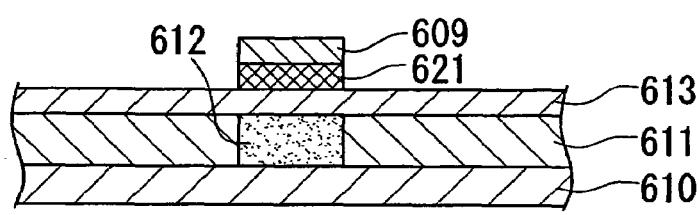

Next, as shown in FIG. 18B, by the plasma CVD method, a gate insulating film 613, an active layer 621, and a contact layer 609 are successively formed. A silicon nitride film used for the gate insulating film 613, an amorphous silicon film used for the active layer 621, and an $n^+$ type silicon film used for the contact layer 609, are formed by changing the material gas and the plasma conditions. If they are formed by the CVD method, a heat history of 300° C. to 350° C. is required. However, it is possible to avoid problems related to the transparency and the thermal resistance by using inorganic material for the banks.

Figure 18C:
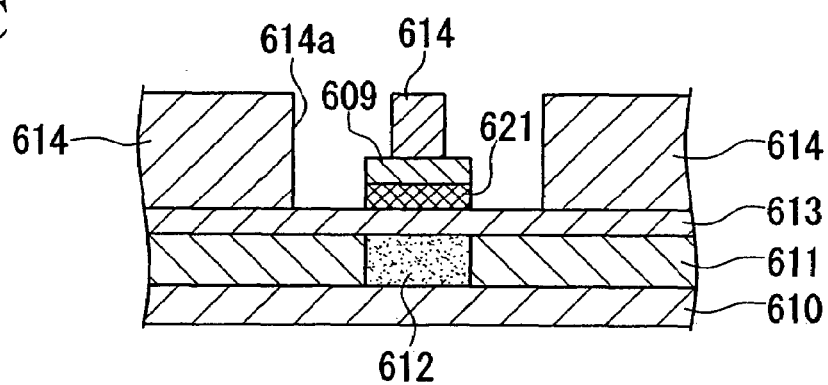
Figure 18D:
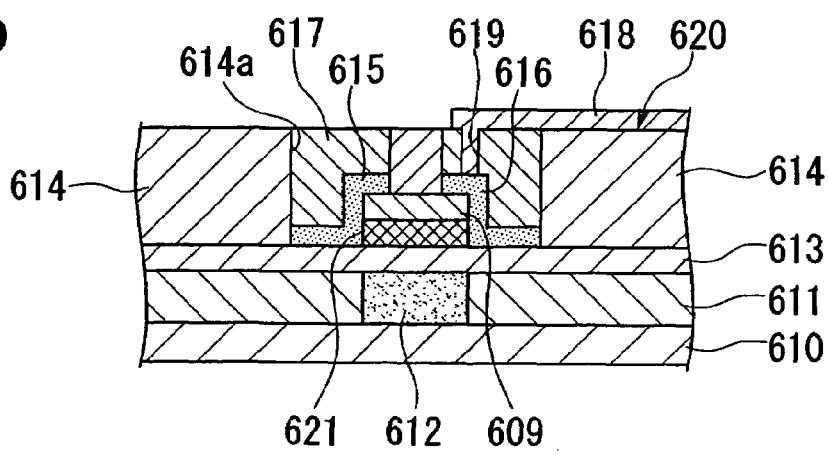

In a second layer bank forming step following the abovementioned semiconductor layer forming step, as shown in FIG. 18C, on the top surface of the gate insulating film 613, second layer banks 614 for providing a ditch 614a of ½₀ to ½₀ times one pixel pitch and crossing the ditch 611a, are formed based on the photolithography method. These banks 614 should be optically transparent and repellent after being formed. For the material, polymeric materials such as acrylic resin, polyimide resin, olefin resin, and melamine resin may be suitably used.

In order to give repellency to these banks 614 after being formed, it is necessary to perform $CF_4$ plasma treatment (plasma treatment using a gas containing a fluorine component). However instead, repellent components (such as fluorine group components) may be previously filled into the material itself of the banks 614. In this case, the $CF_4$ plasma treatment may be omitted.

It is preferable to ensure that the contact angle of the discharge ink with respect to the banks 614 made repellent in the above manner, is above 40°.

In a source/drain electrode forming step following the abovementioned second layer bank forming step, by discharging droplets containing conductive material by the inkjet to fill in the ditch 614a which is the drawing region sectioned by the banks 614, source electrodes 615 and source electrodes 616 crossing the gate scanning electrode 612, are formed. When forming the source electrodes 615 and the drain electrodes 616, the pattern forming method according to the present invention is applied.

For the conductive material at this time, Ag, Al, Au, Cu, palladium, Ni, W-si, and a conductive polymer may be suitably employed. Regarding the source electrodes 615 and the drain electrodes 616 formed in this manner, since the banks 614 are previously imparted with sufficient repellency, a fine wiring pattern can be formed without overflowing beyond the ditch 614a.

Moreover, an insulating material 617 is positioned so as to fill in the ditch 614a which positions the source electrodes 615 and the drain electrodes 616. By the abovementioned steps, on the substrate 610, a flat top surface 620 having the banks 614 and the insulating material 617 is formed.

Then, contact holes 619 are formed in the insulating material 617, and patterned pixel electrodes (ITO) 618 are formed on the top surface 620, and the drain electrodes 616 and the pixel electrodes 618 are connected via the contact holes 619 to thereby form the TFT.

(Electro-Optical Apparatus)

Next is a description of a liquid crystal display which is an example of the electro-optical apparatus of the present invention.

Figure 19:
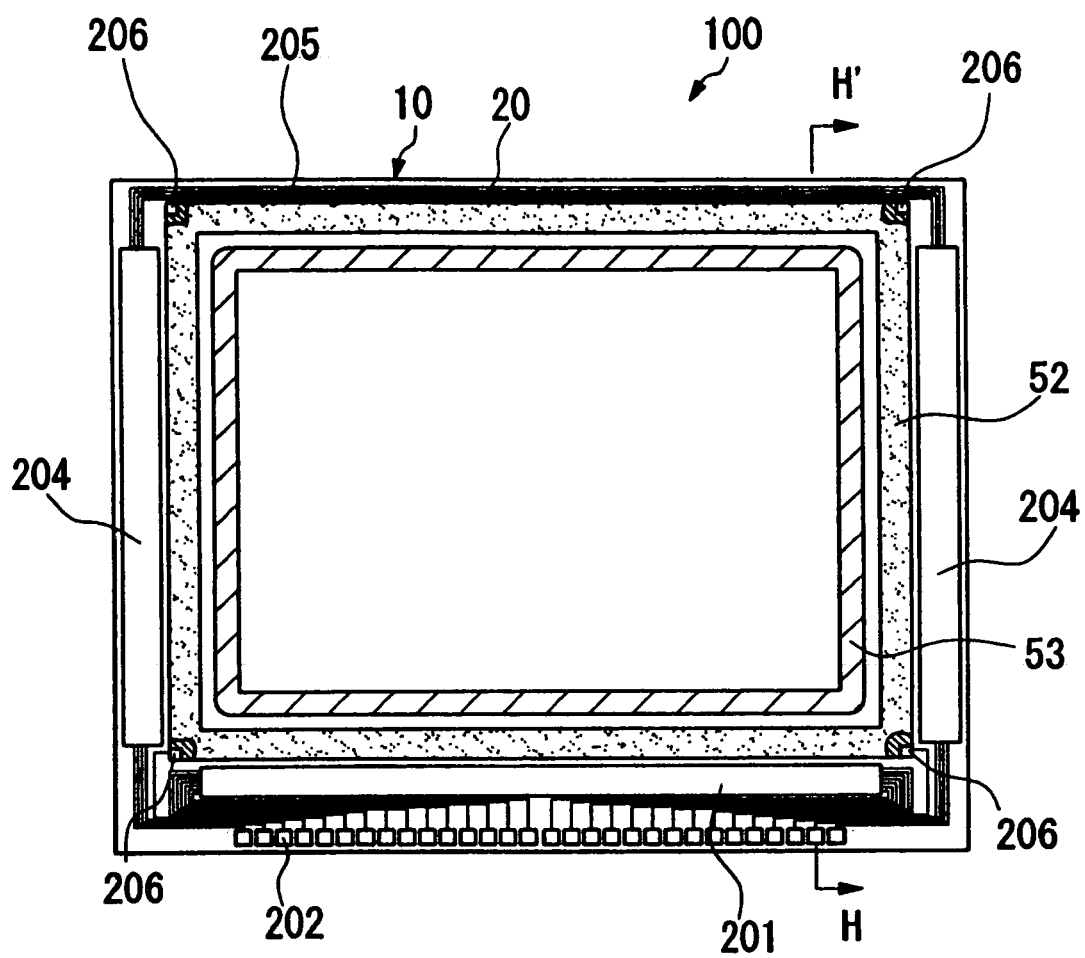
FIG. 19 is a plan view of a liquid crystal display viewed from the side of a facing substrate.
Figure 20:
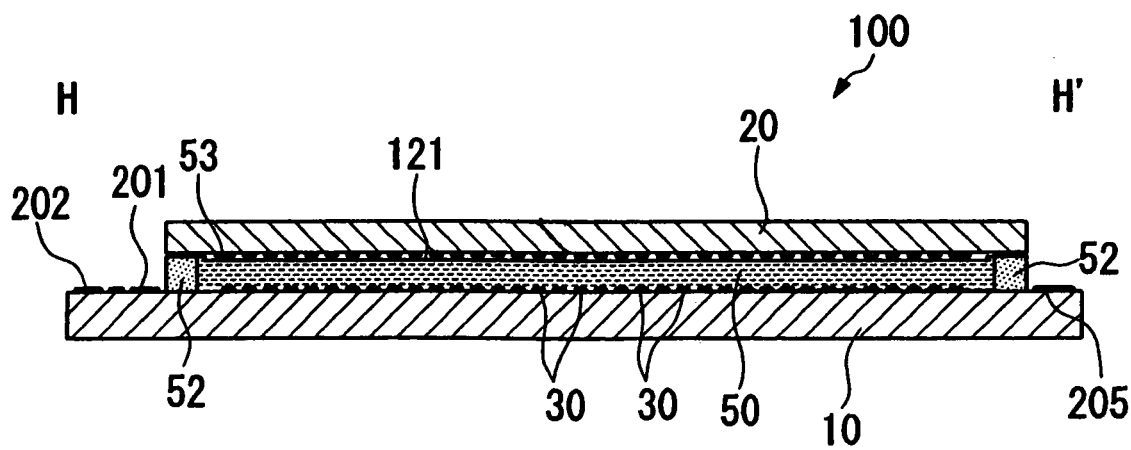
FIG. 20 is a sectional view taken along a line H-H' of FIG. 19.
Figure 21:
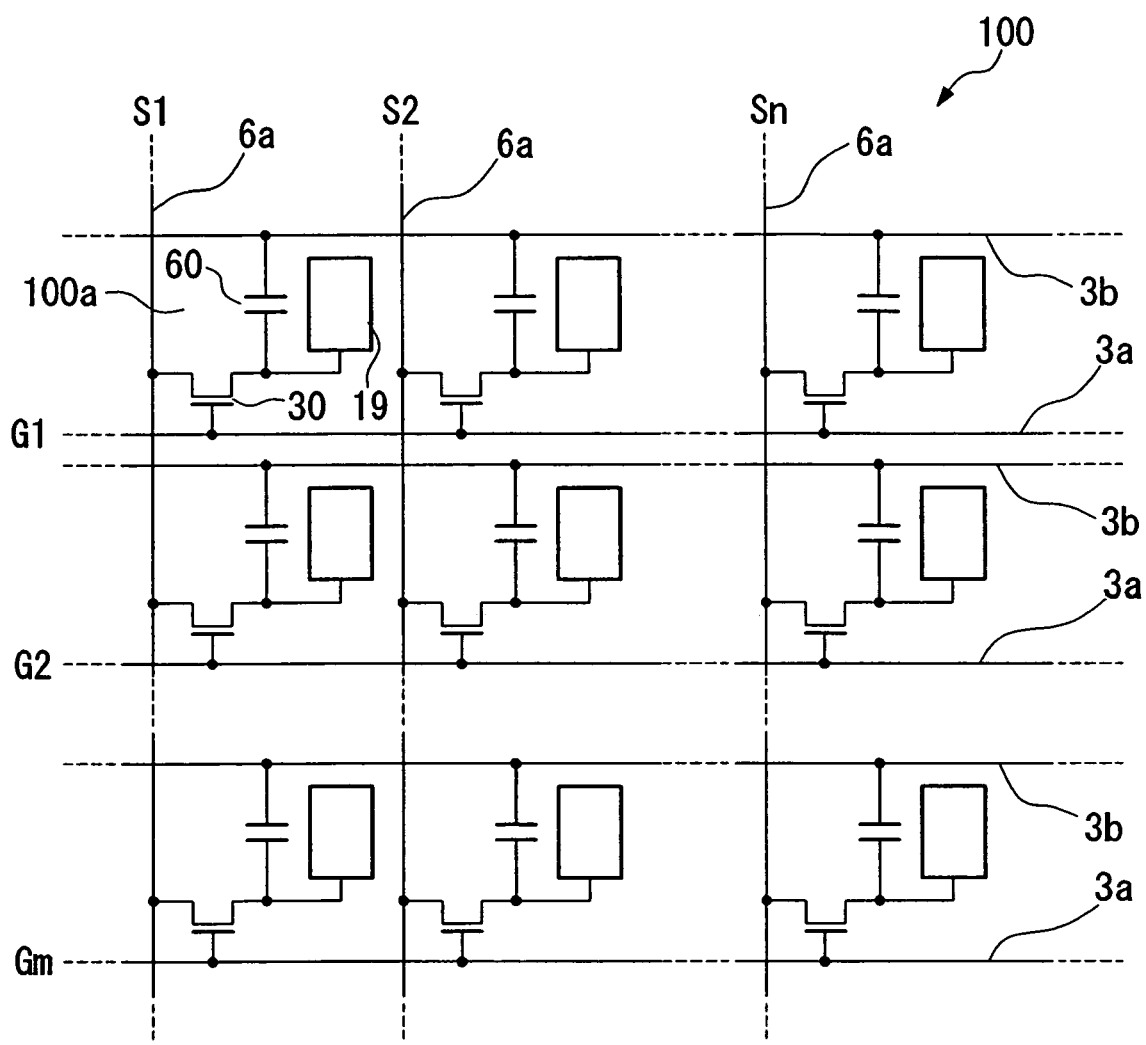
FIG. 21 is an equivalent circuit diagram of the liquid crystal display.
Figure 22:
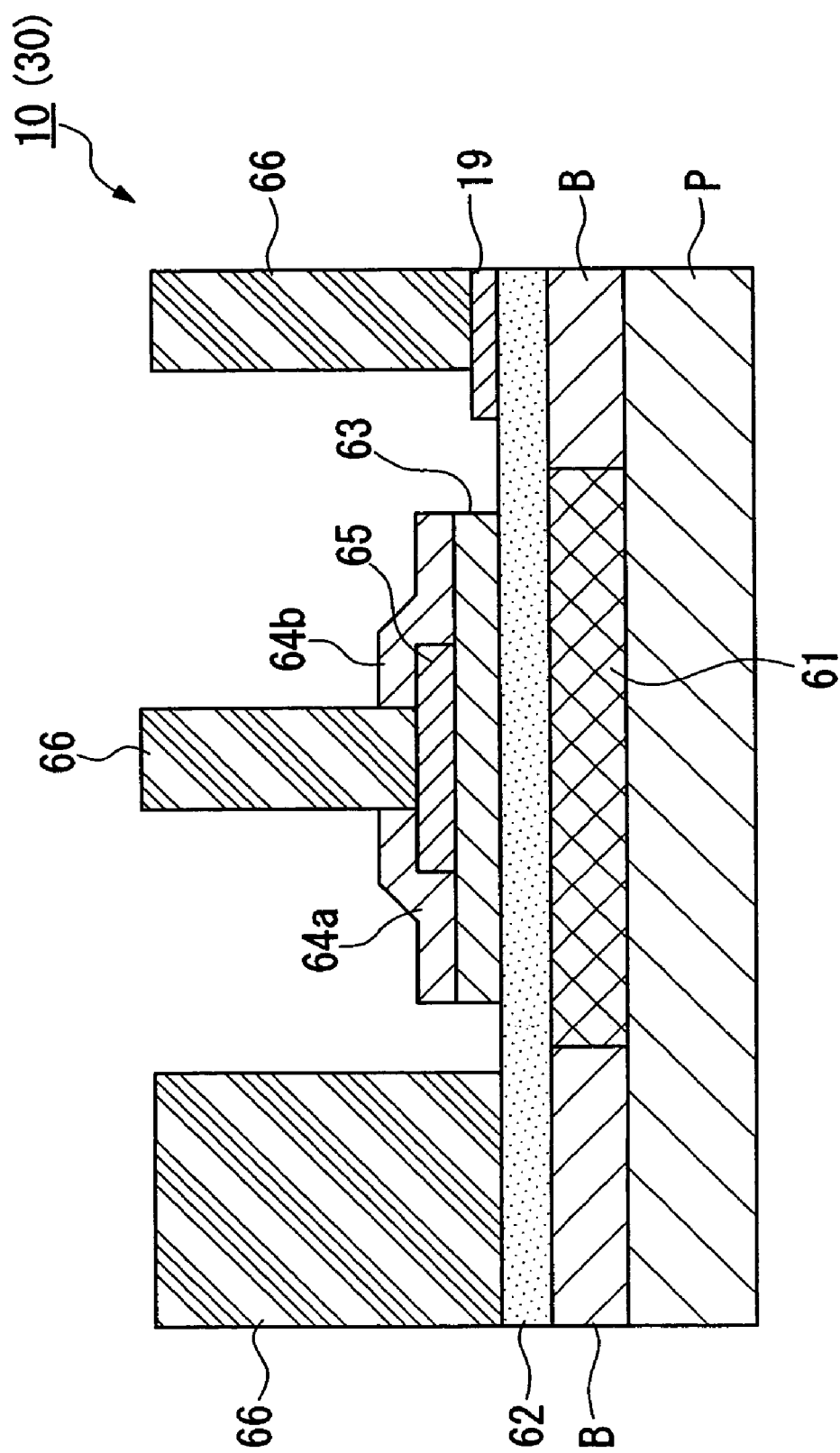
FIG. 22 is an enlarged sectional view of part of the liquid crystal display.

FIG. 19 is a plan view of a liquid crystal display and the respective components according to the present invention, viewed from the facing substrate side. FIG. 20 is a sectional view taken along a line H-H' of FIG. 18. FIG. 21 is an equivalent circuit diagram of various kinds of elements, wiring, and the like in a plurality of pixels formed in a matrix in an image display region of the liquid crystal display. FIG. 22 is an enlarged sectional view of part of the liquid crystal display. In the respective drawings used in the description hereunder, the degree of reduction may differ depending on respective layers and respective members, so as to make them into a recognizable size.

In FIG. 19 and FIG. 20, a liquid crystal display (electro-optical apparatus) 100 of the present embodiment includes; a TFT array substrate 10 and a facing substrate 20 which form a pair with each other, and which are adhered by a sealing material 52 being a photocurable sealing material. A liquid crystal 50 is filled into and retained in a region sectioned by this sealing material 52. The sealing material 52 is formed in a closed frame shape in a region within the substrate surface, and is of a construction with no liquid crystal inlet nor traces of its sealing by a sealing material.

In a region inside of the region formed by the sealing material 52, a peripheral parting 53 being a shading material is formed. Outside of the sealing material 52, a data line driving circuit 201 and mounting terminals 202 are formed along one side of the TFT array substrate 10, and scanning line driving circuits 204 are formed along the two sides adjacent to this side. On the remaining one side of the TFT array substrate 10, a plurality of wirings 205 are provided for connecting between the scanning line driving circuits 204 provided on both sides of the image display region. Moreover, on at lease one section of the comers of the facing substrate 20, intra-substrate conductive materials 206 are provided and disposed for electrically connecting between the TFT array substrate 10 and the facing substrate 20.

Instead of forming the data line driving circuit 201 and the scanning line driving circuits 204 on the TFT array substrate 10, for example, a TAB (Tape Automated Bonding) substrate mounted with a driving LSI, and a terminal group formed at the periphery of the TFT array substrate 10, may be electrically and mechanically connected via an anisotropic conductive film. On the liquid crystal display 100, a phase contrast plate, a polarizing plate, or the like is disposed in a predetermined direction according to the kind of liquid crystal 50 to be used, that is, according to the operation mode such as TN (Twisted Nematic) mode, C-TN method, VA method, IPS method, or normal white mode/normal black mode, however this is not shown here.

Moreover, in the case where the liquid crystal display 100 is constituted for use as a color display, then on the facing substrate 20, for example, color filters of red (R), green (G), and blue (B) are formed with their protective films, in the regions facing the respective pixel electrodes of the TFT array substrate 10, described later.

In the image display region of the liquid crystal display 100 having such a construction, as shown in FIG. 21, a plurality of pixels 100a are configured in a matrix form, TFTs (switching elements) 30 for pixel switching are formed in these respective pixels 100a, and data lines 6a which supply pixel signals S1, S2, to Sn, are electrically connected to the sources of the TFTs 30. The pixel signals S1, S2, to Sn, for writing to the data lines 6a may be line-sequential supplied in this order, or may be supplied to each group with respect to adjacent pairs of data lines 6a. Moreover, the configuration is such that the scanning lines 3a are electrically connected to the gates of the TFTs 30, and scanning signals G1, G2, to Gm are applied pulsewise to the scanning lines 3a, in this line-sequential order at a predetermined timing.

The pixel electrodes 19 are electrically connected to the drains of the TFTs 30 so as to power ON the TFTs 30 which are the switching elements, only in a fixed period so that the pixel signals S1, S2, to Sn supplied from the data lines 6a can be written into the respective pixels at a predetermined timing. In this manner, the pixel signals S1, S2, to Sn of the predetermined level written into the liquid crystal through the pixel electrodes 19 are retained for a fixed period between counter electrodes 121 of the facing substrate 20 shown in FIG. 20. In order to prevent leakage of the retained pixel signals S1, S2, to Sn, storage capacitances 60 are added in parallel to the liquid crystal capacitances formed between the pixel electrodes 19 and the counter electrodes 121. For example, the voltage of the pixel electrodes 19 is retained by the storage capacitances 60 for a time which is thousands of times longer than the time for which the source voltage is applied. Consequently, the retention property of the electric charge can be improved so as to realize a liquid crystal display 100 having a high contrast ratio.

FIG. 22 is an enlarged sectional view of part of the liquid crystal display 100 having a bottom gate type TFT 30. On a glass substrate P constituting a TFT array substrate 10, a gate wiring 61 as a conductive film is formed by the abovementioned pattern forming method.

On the gate wiring 61, a semiconductor layer 63 composed of an amorphous silicon (a-Si) layer is laminated via a gate insulating film 62 composed of SiNx. A portion of the semiconductor layer 63 facing this gate wiring portion is a channel region. On the semiconductor layer 63, connection layers 64a and 64b composed of, for example, an n$^+$ type a-Si layer, are laminated for obtaining ohmic connection. On the semiconductor layer 63 in the center of the channel region, an insulative etch stop film 65 composed of SiNx for protecting the channel is formed. After the deposition (CVD) of these gate insulating film 62, semiconductor layer 63, and etch stop film 65, the resist is coated, exposed, developed, and photoetched so that the patterning is formed as shown in the drawing.

Furthermore, on the connection layers 64a and 64b and a pixel electrode 19 composed of ITO, films are similarly formed and photoetched so that the patterning is formed. Then, banks 66 are respectively protrudingly provided on the pixel electrode 19, the gate insulating film 62, and the etch stop film 65. By discharging droplets of silver compound between these banks 66 using the abovementioned droplet discharge apparatus IJ, the source line and drain line can be formed.

Regarding the liquid crystal display of the present embodiment, since it is possible to accurately and stably form the conductive film which can be made finer with thinner lines by the abovementioned pattern forming method, high quality and high performance can be obtained.

In the above embodiment, the configuration is one where the TFTs 30 are used as switching elements for driving the liquid crystal display 100. However besides the liquid crystal display, for example, it may be applied to an organic EL (electroluminescence) display device. An organic EL display device has a configuration where a thin film containing fluorescent inorganic or organic compounds is sandwiched between a negative electrode and a positive electrode. It is a device in which electrons and positive holes (holes) are injected to excite the thin film and produce excitons, and uses the light emitted (fluorescence, phosphorescence) when the excitons are recombined to generate light. Moreover, on the substrate having the TFTs 30, of the fluorescent materials used for the organic EL display device, materials showing the respective fluorescent colors of red, green and blue, that is a fluorescent layer forming material, and materials for forming the electron holes injecting/electron transferring layer, are used for the ink, and the respective layers are patterned so that a self-fluorescing full color EL device can be manufactured. The scope of the device (electro-optical apparatus) in the present invention includes such an organic EL device.

Figure 23:
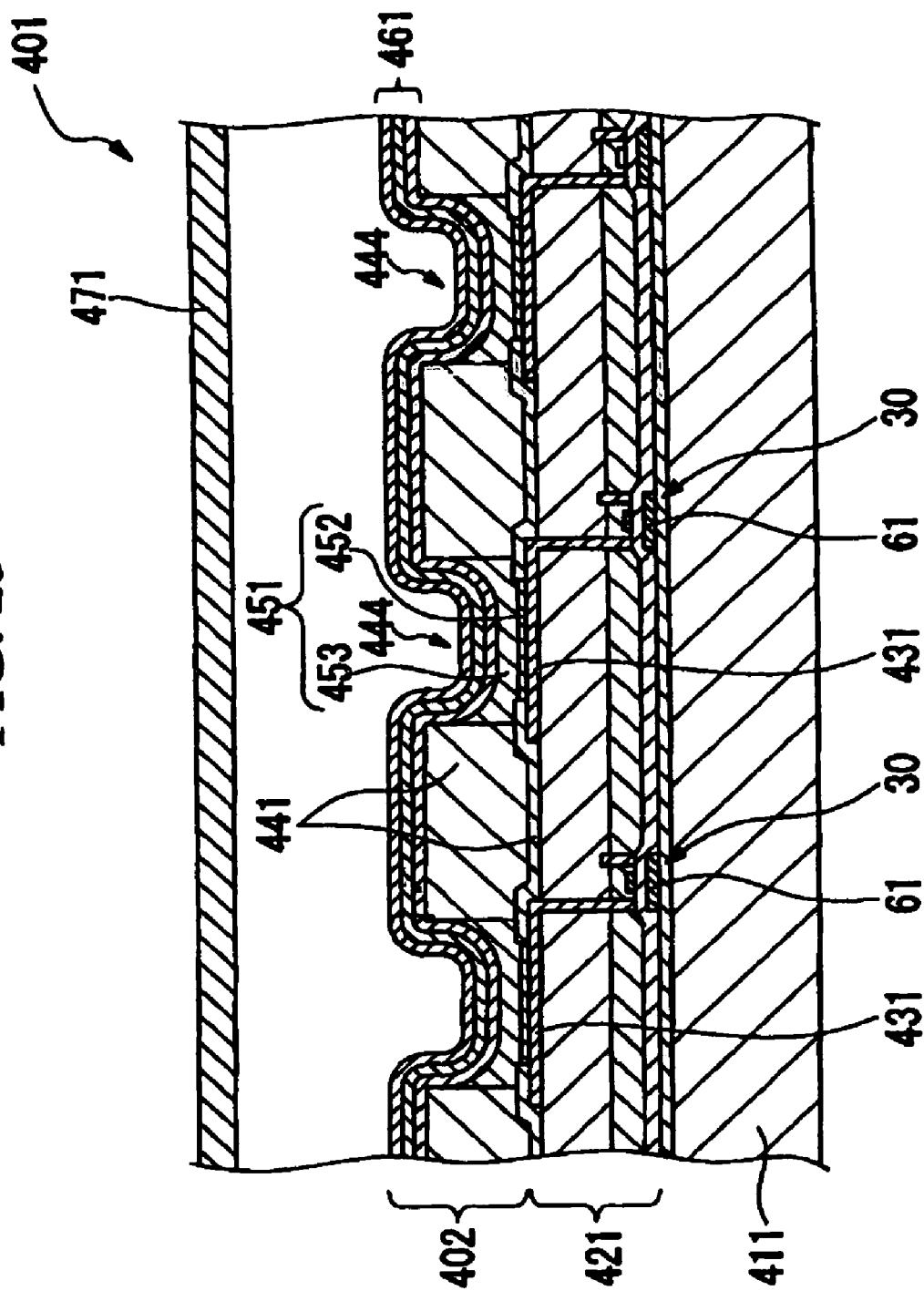
FIG. 23 is an enlarged sectional view of part of an organic EL apparatus.

FIG. 23 is a sectional side view of an organic EL apparatus in which some components are manufactured by the aforementioned droplet discharge apparatus IJ. A general configuration of the organic EL apparatus is described with reference to FIG. 23.

In FIG. 23, an organic EL apparatus 401 is an organic EL element 402 having a substrate 411, a circuit element section 421, pixel electrodes 431, bank sections 441, light emission elements 451, a negative electrode 461 (counter electrode), and a sealing substrate 471 connected to wiring of a flexible substrate (not shown) and a driving IC (not shown). The circuit element section 421 is an active element TFT 60 formed on the substrate 411, having a configuration such that a plurality of pixel electrodes 431 are arrayed on the circuit element section 421. Moreover, a gate wiring 61 constituting the TFT 60 is formed by the wiring pattern forming method of the above embodiment.

Between the respective pixel electrodes 431, the bank sections 441 are formed in grid form. In a crevice opening 444 produced by the bank sections 441, a light emission element 451 is formed. The light emission element 451 is composed of an element which emits red fluorescence, an element which emits green fluorescence, and an element which emits blue fluorescence. Therefore the organic EL apparatus 401 can display in full colors. The negative electrode 461 is formed over the whole top surface of the bank sections 441 and the light emission elements 451. On the negative electrode 461, the sealing substrate 471 is laminated.

The manufacturing process of the organic EL apparatus 401 including the organic EL element includes; a bank section forming step for forming the bank sections 441, a plasma treatment step for appropriately forming the light emission elements 451, a light emission element forming step for forming the light emission elements 451, a counter electrode forming step for forming the negative electrode 461, and a sealing step for laminating the sealing substrate 471 onto the negative electrode 461 so as to seal it.

The light emission element forming step is one where on a crevice opening 444, that is a pixel electrode 431, an electron holes injecting layer 452 and a fluorescent layer 453 are formed so as to form a light emission element 451, and includes an electron holes injecting layer forming step and a fluorescent layer forming step. The electron holes injecting layer forming step includes a first discharging step for discharging a liquid material for forming the electron holes injecting layer 452 onto the respective pixel electrode 431, and a first drying step for drying the discharged liquid material so as to form the electron holes injecting layer 452. Moreover, the fluorescent layer forming step includes a second discharging step for discharging a liquid material for forming the fluorescent layer 453 onto the electron holes injecting layer 452, and a second drying step for drying the discharged liquid material so as to form the fluorescent layer 453. As described above, the fluorescent layer 453 is composed of three kinds formed by materials corresponding to the three colors of red, green and blue. Therefore, the second discharging step includes three steps for respectively discharging the three kinds of materials.

In this light emission element forming step, the droplet discharge apparatus IJ may be used at the first discharging step in the electron holes injecting layer forming step, and at the second discharging step in the fluorescent layer forming step.

The device (electro-optical apparatus) according to the present invention is also applicable, in addition to the abovementioned devices, to a PDP (plasma display panel) and a surface-conduction-type electron emission element or the like which utilizes a phenomenon where current flows in parallel with the surface of a small sized thin film formed on a substrate so as to cause electron emission.

Figure 24:
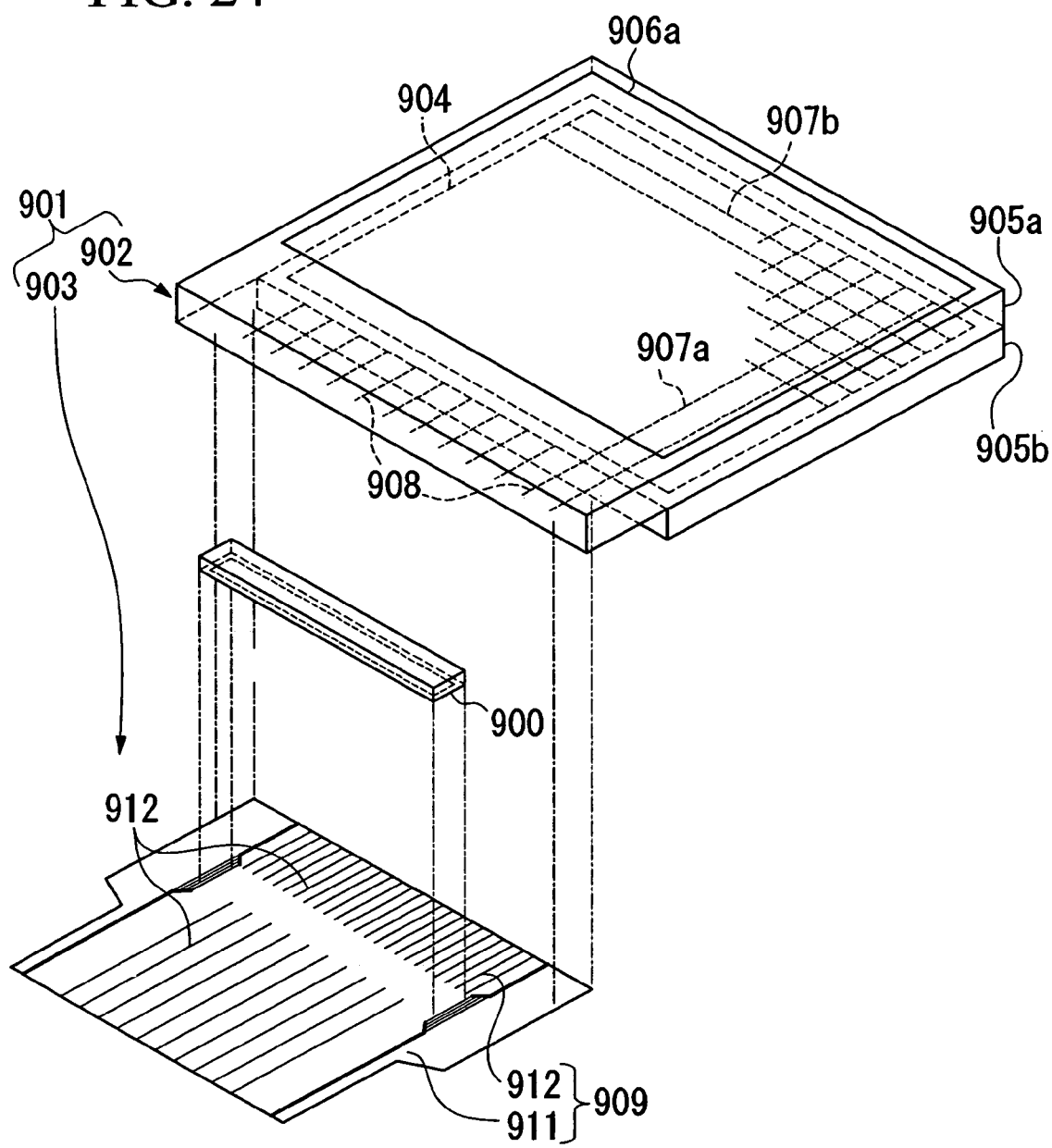
FIG. 24 shows another example of a liquid crystal display.

FIG. 24 shows another embodiment of a liquid crystal display.

The liquid crystal display (electro-optical apparatus) 901 shown in FIG. 24 includes in general, a color liquid crystal panel (electro-optical panel) 902 and a circuit substrate 903 connected to the liquid crystal panel 902. Moreover, a lighting system such as a backlight or the like and other incidental equipment are attached to the liquid crystal panel 902 as required.

The liquid crystal panel 902 has a pair of substrates 905a and 905b adhered by a sealing material 904. In a space formed between these substrates 905a and 905b, being a so called cell gap, a liquid crystal is enclosed. These substrates 905a and 905b are generally formed from an optically transparent material, for example, a glass, plastics, or the like. On the outer surface of the substrates 905a and 905b, a polarizing plate 906a and another polarizing plate are adhered. In FIG. 24, the other polarizing plate is not shown.

Moreover electrodes 907a are formed on the inner surface of the substrate 905a and electrodes 907b are formed on the inner surface of the substrate 905b. These electrodes 907a and 907b are formed in stripes, letters, numeric characters, or other appropriate patterns. Moreover, these electrodes 907a and 907b are formed from an optically transparent material, for example such as indium tin oxide (ITO). The substrate 905a has a projecting section which projects from the substrate 905b. On this projecting section, a plurality of terminals 908 are formed. These terminals 908 are formed at the same time as when the electrodes 907a are formed on the substrate 905a. Therefore, these terminals 908 are formed from ITO for example. These terminals 908 include ones integrally extending from the electrodes 907a, and ones connected to the electrodes 907b via a conductive material (not shown).

On the circuit substrate 903, a semiconductor element 900 serving as a liquid crystal driving IC is mounted in a predetermined position on a wiring substrate 909. Although not shown, on a predetermined position of an other part except for the part mounted with the semiconductor element 900, a resistor, a capacitor, and other chip parts may be mounted. The wiring substrate 909 is manufactured by patterning a metal film such as Cu formed on a flexible base substrate 911 such as a polyimide or the like, to form a wiring pattern 912.

In the present embodiment, the electrodes 907a and 907b on the liquid crystal panel 902 and the wiring pattern 912 on the circuit substrate 903 are formed by the abovementioned method of manufacturing a device.

According to the liquid crystal display of the present embodiment, it becomes possible to obtain a high quality liquid crystal display, in which unevenness of the electrical characteristic is annulled.

The example described above is a passive type liquid crystal panel. However it may be an active matrix type liquid crystal panel. That is, a thin film transistor (TFT) is formed on one substrate and a pixel electrode is formed for each TFT. Moreover, the wiring (gate wiring and source wiring) to be electrically connected to each TFT may be formed using the inkjet technique as described above. On the other hand, a counter electrode or the like is formed on the facing substrate The present invention may be also be applied to such active matrix type liquid crystal panels.

The device (electro-optical apparatus) according to the present invention is also applicable, in addition to the abovementioned devices, to a PDP (plasma display panel) and a surface-conduction-type electron emission element or the like which utilizes a phenomenon where current flows in parallel to the surface of a small sized thin film formed on a substrate so as to cause electron emission.

(Electronic Apparatus)

Next is a description of specific examples of electronic apparatus of the present invention.

Figure 25A:
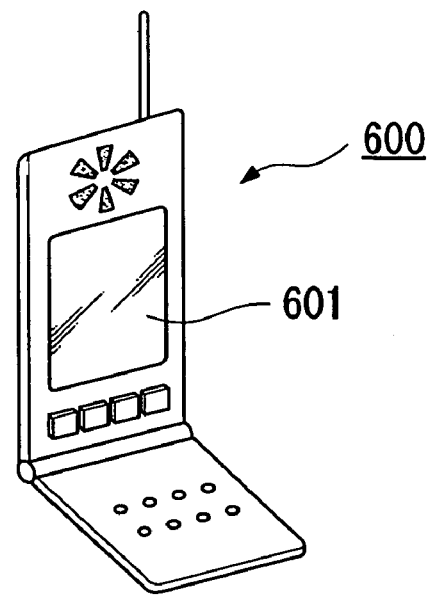
FIG. 25A to FIG. 25C show specific examples of electronic apparatus of the present invention.

FIG. 25A is a perspective view showing an example of a portable telephone. In FIG. 25A, reference symbol 600 denotes a portable telephone main unit, and reference symbol 601 denotes a liquid crystal display section having a liquid crystal display.

Figure 25B:
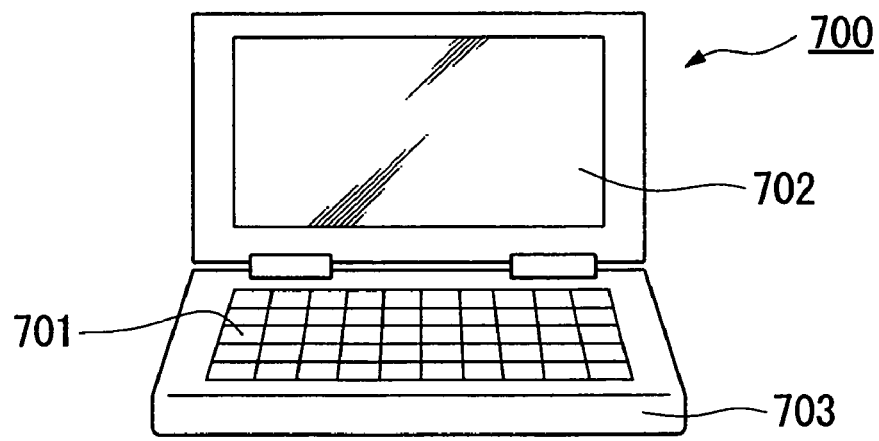

FIG. 25B is a perspective view showing an example of a portable information processing device, such as a word processor and personal computer. In FIG. 25B, reference symbol 700 denotes an information processing device, reference symbol 701 denotes an input section such as a keyboard, reference symbol 703 denotes an information processor main unit, and reference symbol 702 denotes a liquid crystal display section having the liquid crystal display of the above embodiment.

Figure 25C:
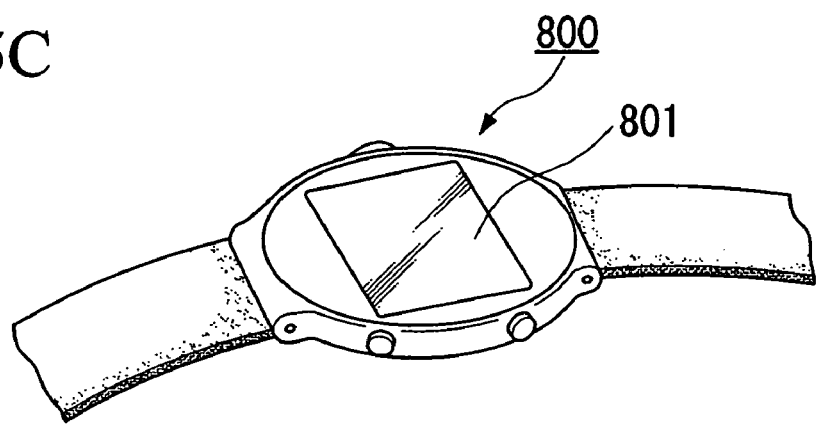

FIG. 25C is a perspective view showing an example of watch type electronic equipment. In FIG. 25C, reference symbol 800 denotes a watch main unit, and reference symbol 801 denotes a liquid crystal display section having the liquid crystal display of the above embodiment.

Since the electronic apparatus FIG. 25A to FIG. 25C include crystal displays of the above embodiment, it becomes possible to obtain high quality and performance.

The electronic apparatus of the present embodiment include liquid crystal devices. However, they may be electronic apparatus having another electro-optical apparatus such as an organic electroluminescence display device, a plasma display device, or the like.

Next is a description of an example of where a pattern formed by the pattern forming method of the present invention is applied to an antenna circuit.

Figure 26:
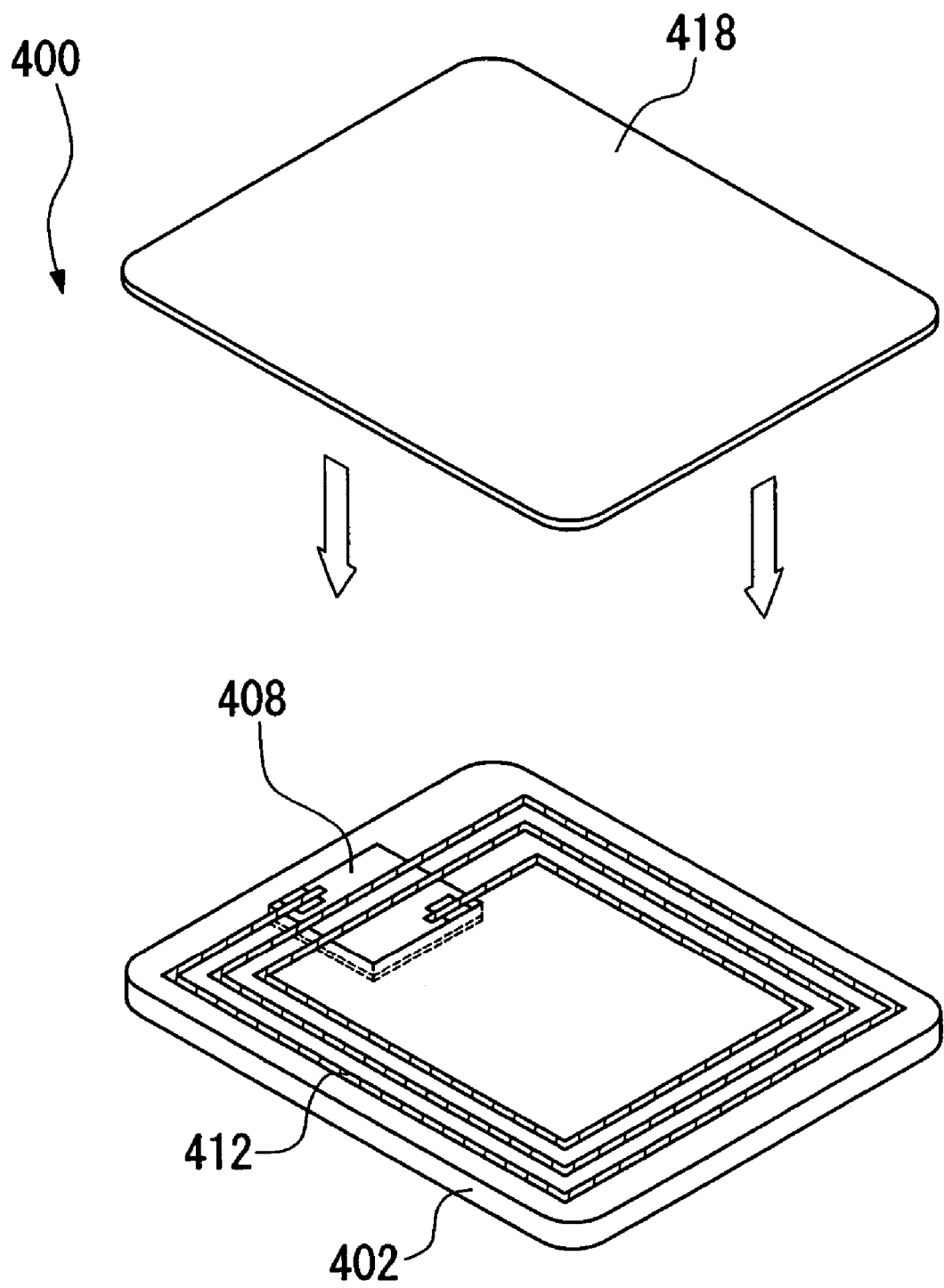
FIG. 26 is an exploded perspective view of a non-contact card medium.

FIG. 26 shows a non-contact card medium according to the present embodiment. The non-contact card medium 400 has a semiconductor integrated circuit chip 408 and an antenna circuit 412 built into a body included of a card body 402 and card cover 418, and performs at least one of power supply and data transfer with an external transmitter (not shown) by at least one of electromagnetic waves and electric capacitance coupling.

In the present embodiment, the antenna circuit 412 is formed based on the wiring pattern forming method of the present invention. Therefore, the antenna circuit 412 can be made finer with thinner lines, enabling high quality and performance to be obtained.

As mentioned above, while preferred embodiments have been described and illustrated above, it should be understood that these are exemplary of the invention and are not to be considered as limiting. The forms and the combinations of respective components shown in the examples, are but one example and may be variously modified according to design requirement or the like, without departing from the spirit or scope of the present invention.

What is claimed is:

1. A method of forming a predetermined pattern by disposing a functional liquid on a substrate, comprising:

forming banks on the substrate so that a first region having a width greater than a diameter of in-flight functional liquid and a second region having a width narrower than the width of the first region are delimited; and discharging the functional liquid on the first region so as to cause the functional liquid to flow into the second region.

2. A method of forming a pattern according to claim 1, wherein a width of the first region is 110 to 500% of the width of the second region.

3. A method of forming a pattern according to claim 1, further comprising:

discharging the functional liquid so as to dispose the functional liquid on a crossing region on which the first region is crossed over the second region.

4. A method of forming a pattern according to claim 1, further comprising:

discharging the functional liquid on a crossing region on which the first region is crossed over the second region, after discharging the functional liquid so as to surround the crossing region.

5. A method of forming a pattern according to claim 1, wherein the functional liquid contains conductive particles.

* * * * *